(12) United States Patent
Leung et al.

(10) Patent No.: US 12,324,129 B2
(45) Date of Patent: Jun. 3, 2025

(54) ACTUATING HEATSINK FOR PLUGGABLE MODULES

(71) Applicant: Juniper Networks, Inc., Sunnyvale, CA (US)

(72) Inventors: Jimmy Chun-Chuen Leung, Fremont, CA (US); John Ferullo, Westford, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 248 days.

(21) Appl. No.: 18/085,272

(22) Filed: Dec. 20, 2022

(65) Prior Publication Data

US 2024/0206127 A1 Jun. 20, 2024

(51) Int. Cl.
*H05K 7/20* (2006.01)
*H05K 7/10* (2006.01)

(52) U.S. Cl.
CPC ....... *H05K 7/20418* (2013.01); *H05K 7/2049* (2013.01); *H05K 7/20509* (2013.01); *H05K 7/10* (2013.01)

(58) Field of Classification Search
CPC .... H05K 7/20418; H05K 7/2049; H05K 7/10; H05K 7/20509
See application file for complete search history.

(56) References Cited

U.S. PATENT DOCUMENTS

| 10,741,953 | B1 | 8/2020 | Huang et al. | |
|---|---|---|---|---|
| 2013/0157499 | A1* | 6/2013 | Crippen | H01R 12/724 439/487 |
| 2014/0170898 | A1* | 6/2014 | Elison | H05K 7/20409 439/487 |
| 2020/0257067 | A1* | 8/2020 | Meunier | G02B 6/4284 |
| 2021/0103108 | A1 | 4/2021 | Wall, Jr. et al. | |
| 2023/0258891 | A1* | 8/2023 | Gupta | H05K 7/20409 361/688 |

FOREIGN PATENT DOCUMENTS

| EP | 3955039 A1 | 2/2022 |
|---|---|---|
| WO | 2021249640 A1 | 12/2021 |

OTHER PUBLICATIONS

Extended European Search Report for Application No. EP23157634. 9, mailed on Aug. 24, 2023, 10 pages.

* cited by examiner

Primary Examiner — Jacob R Crum
(74) Attorney, Agent, or Firm — Harrity & Harrity, LLP

(57) ABSTRACT

In some implementations, a heatsink assembly may include a heatsink that transfers heat from a pluggable module plugged into a frame, a clip coupling the heatsink to the frame and biasing the heatsink toward the pluggable module when the pluggable module is plugged into the frame, and an actuator plate that engages with the pluggable module as the pluggable module is plugged into the frame and thereby translates between an activated position and a deactivated position. When the actuator plate is in the activated position, the actuator plate may lift the heatsink away from the pluggable module, and, when the actuator plate is in the deactivated position, the actuator plate may permit the heatsink to engage the pluggable module. The actuator plate may translate from the activated position to the deactivated position by contacting the pluggable module as the pluggable module is plugged into the frame.

15 Claims, 17 Drawing Sheets

ACTUATING HEATSINK FOR PLUGGABLE MODULES

BACKGROUND

Electronic devices (e.g., network components) may be manufactured according to industry standards that specify the size, shape, form factor, and/or electronic performance of the electronic device. The use of such standards allows similar electronic devices produced by different manufacturers to be used interchangeably within a data processing unit (e.g., a router, a switch, a server, or a similar unit). Because the size, shape, and/or form factor of such electronic devices are dictated by industry standards, in certain instances limited flexibility may exist to change the design of an electronic device to improve heat dissipation, increase power levels, or otherwise improve performance. Accordingly, some data processing units include heatsinks and/or other ancillary devices external to the electronic devices to improve the overall performance of the electronic devices.

For example, some optical transceivers are manufactured according to an industry standard known as the small form-factor pluggable (SFP) standard. Various other standards may be employed. Optical transceivers manufactured according to the SFP standard or a similar standard are configured to be "pluggable" such that the optical transceiver can be inserted and/or removed from the host data processing unit without removing power from the unit. Some optical transceivers are installed inside of the host data processing unit within a protective cage or enclosure that includes a heatsink to dissipate heat from a surface of the optical transceiver. For example, the protective cage or enclosure may include a spring-loaded heatsink assembly configured to apply positive pressure to an optical transceiver when the optical transceiver is within the cage, thereby dissipating heat from the optical transceiver during operation.

SUMMARY

Some implementations described herein relate to a system. The system may include a frame configured to removably receive a pluggable module within an interior cavity and a heatsink assembly coupled to the frame. The heatsink assembly may include a heatsink configured to transfer heat from the pluggable module, a clip coupling the heatsink to the frame and configured to bias the heatsink toward the interior cavity, and an actuator plate configured to engage with the pluggable module when the pluggable module is within the interior cavity and thereby translate between an activated position and a deactivated position. When the actuator plate is in the activated position, the actuator plate may lift the heatsink away from the pluggable module, and when the actuator plate is in the deactivated position, the actuator plate may permit the heatsink to engage the pluggable module. The actuator plate may be configured to translate from the activated position to the deactivated position in response to contacting the pluggable module as the pluggable module is plugged into the frame.

Some implementations described herein relate to a device. The device may include a heatsink configured to transfer heat from a pluggable module when the pluggable module is plugged into a frame, a clip coupled to the heatsink and configured to couple the heatsink to the frame and bias the heatsink toward the pluggable module when the pluggable module is plugged into the frame, and an actuator plate configured to engage with the pluggable module as the pluggable module is plugged into the frame and thereby translate between an activated position and a deactivated position. When the actuator plate is in the activated position, the actuator plate may lift the heatsink away from the pluggable module, and, when the actuator plate is in the deactivated position, the actuator plate may permit the heatsink to engage the pluggable module. The actuator plate may be configured to translate from the activated position to the deactivated position by contacting the pluggable module as the pluggable module is plugged into the frame.

Some implementations described herein relate to a method of manufacturing a frame assembly. The method may include receiving a frame configured to house a pluggable module. The method may include movably coupling a heatsink to the frame such that the heatsink is biased toward an interior cavity of the frame. The method may include slidably coupling an actuator plate to the frame such that the actuator plate is configured to engage with the pluggable module as the pluggable module is plugged into the frame and thereby translate between an activated position and a deactivated position, wherein, when the actuator plate is in the activated position, the actuator plate lifts the heatsink away from the pluggable module, wherein, when the actuator plate is in the deactivated position, the actuator plate permits the heatsink to engage the pluggable module, and wherein the actuator plate is configured to translate from the activated position to the deactivated position by contacting the pluggable module as the pluggable module is plugged into the frame.

DETAILED DESCRIPTION

Figure 1A:
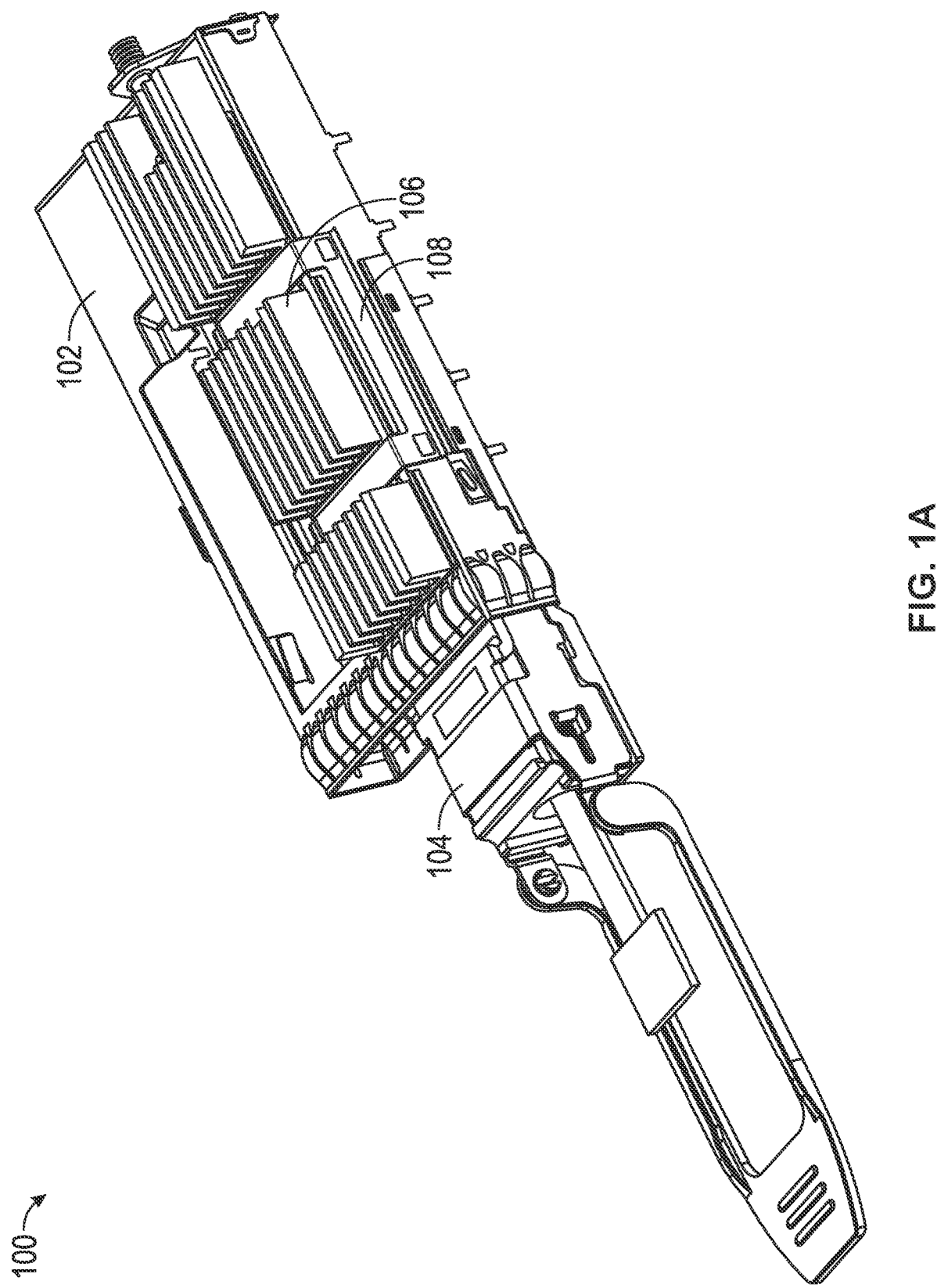
FIGS. 1A-1F are diagrams of an example system associated with an actuating heatsink for pluggable modules.

The following detailed description of example implementations refers to the accompanying drawings. The same reference numbers in different drawings may identify the same or similar elements.

Pluggable modules, such as optical transceivers or similar modules, may be insertable into a data processing unit (e.g., a router, a switch, a server, or a similar data processing unit) in order to facilitate one or more functions of the data processing unit. For example, an optical transceiver may be insertable into a data processing unit in order to facilitate optical communications with the data processing unit via one or more optical cables received within the optical transceiver. In such examples, a pluggable module may generate high temperatures during operation, with the heat generated being proportional to a power level and/or a bandwidth at which the pluggable module is operating. Accordingly, various heat transfer mechanisms may be associated with the pluggable module and/or the data processing unit in order to dissipate heat and thereby improve the performance of the pluggable module and/or the data processing unit.

In some examples, a pluggable module (e.g., an optical transceiver) may be associated with a heatsink assembly configured to dissipate heat from the pluggable module during operation. The heatsink assembly may include a heatsink (sometimes referred to herein as a pedestal) that is spring loaded or otherwise biased toward an interior cavity of a frame (sometimes referred to herein as a cage and/or an optics cage) configured to receive the pluggable module. In this regard, when the pluggable module is inserted into the frame (and, more particularly, when the pluggable module is inserted into the interior cavity of the fame), the biased heatsink may firmly contact the pluggable module and thereby dissipate heat from the pluggable module during operation.

In such examples, as the pluggable module is inserted into the frame, the pluggable module may engage the spring-loaded heatsink, thereby compressing the spring and lifting the heatsink upward. The pluggable module thus rubs against the spring-loaded heatsink while the pluggable module is being inserted and seated in the frame. The rubbing contact between the pluggable module and the heatsink may result in excessive wear on the heatsink surface, leading to premature failure and/or reduced heat transfer performance of the heatsink. Moreover, due to the rubbing interaction of the pluggable module and the spring-loaded heatsink during insertion and extraction, the use of a thermal interface material (TIM) at the thermal interface between the heatsink and the pluggable module may be precluded, because the rubbing action would abrade the TIM and thus degrade TIM effectiveness. Accordingly, the thermal interface between the pluggable module and the heatsink may be formed via metal-on-metal contact, resulting in a relatively high thermal resistance and thus poor heat transfer performance. As a result, heat transfer between a pluggable module and a heatsink remains limited, resulting in low power levels, low bandwidth, and otherwise reduced performance achievable by the pluggable module.

Some implementations described herein enable an actuating heatsink assembly for use with a pluggable module (e.g., an optical transceiver) that is movable between a raised position, in which a heatsink of the heatsink assembly does not contact the pluggable module during insertion and extraction of the pluggable module, and a lowered position, in which the heatsink firmly contacts the pluggable module once the pluggable module is fully inserted and seated in a frame, thereby providing heat transfer from the pluggable module during operation. In some implementations, the heatsink assembly may include an actuator plate that translates between an activated position when the pluggable module is not fully inserted into the frame, and a deactivated position when the pluggable module is fully inserted into the frame. When the actuator plate is in the activated position (e.g., when the pluggable module is not fully seated within the frame), the actuator plate may lift the heatsink away from the pluggable module, thereby preventing rubbing on the pluggable module as the pluggable module is inserted into or extracted from the frame. However, when the actuator plate is in the deactivated position (e.g., when the pluggable module is fully seated within the frame), the actuator plate may permit the heatsink to engage the pluggable module, thereby forming a positively pressured thermal interface between the pluggable module and the heatsink. In this regard, because the pluggable module and heatsink do not rub against one another during insertion and extraction of the pluggable module, the implementations described herein may prevent premature wear of the heatsink and enable the use of TIMs at the thermal interface. As a result, a thermal resistance of the thermal interface may be reduced, thereby improving the heat transfer performance of the heatsink, enabling the use of higher power and/or higher bandwidth pluggable modules. For example, optical transceivers of various form factors (e.g., quad small form-factor pluggable (QSFP), small form-factor pluggable (SFP), octal small form-factor pluggable (OSFP), C form-factor pluggable (CFP), and/or similar form-factor pluggable modules) and power levels may be employed with adequate heat transfer being provided by the various implementations of the heatsink assembly described herein. These and other benefits may be more apparent with reference to the drawings and following description.

Figure 1B:
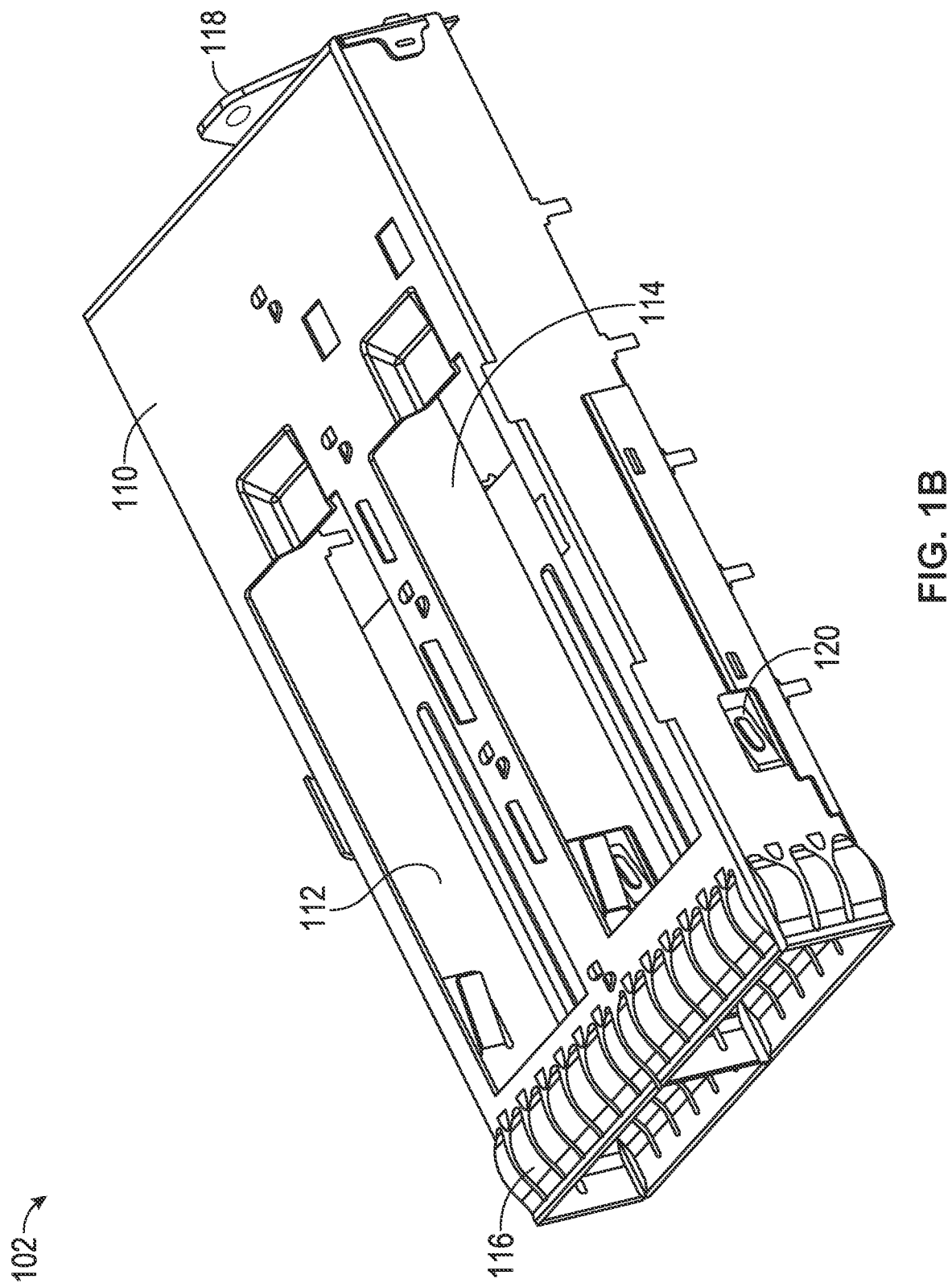
Figure 1C:
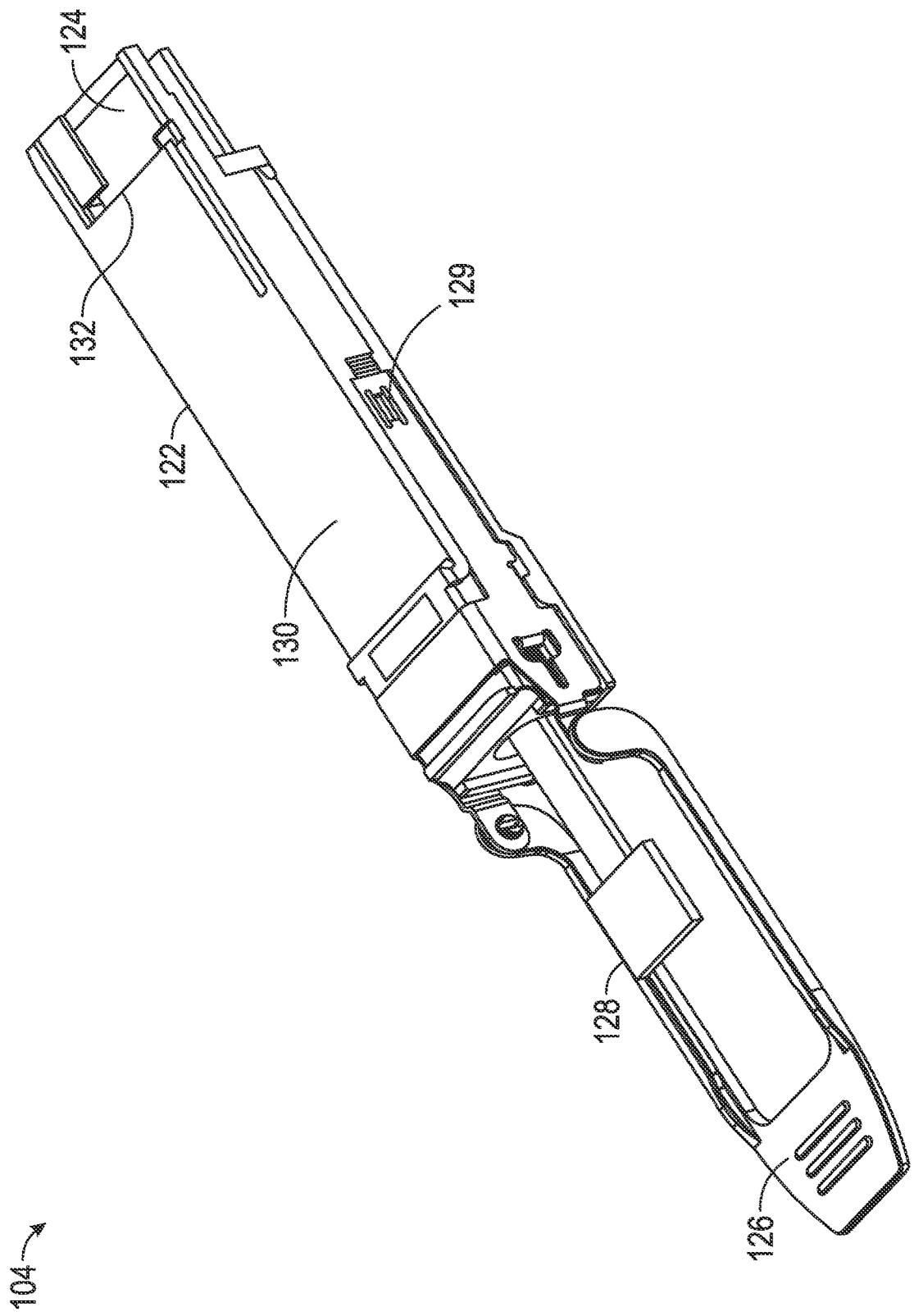
Figure 1D:
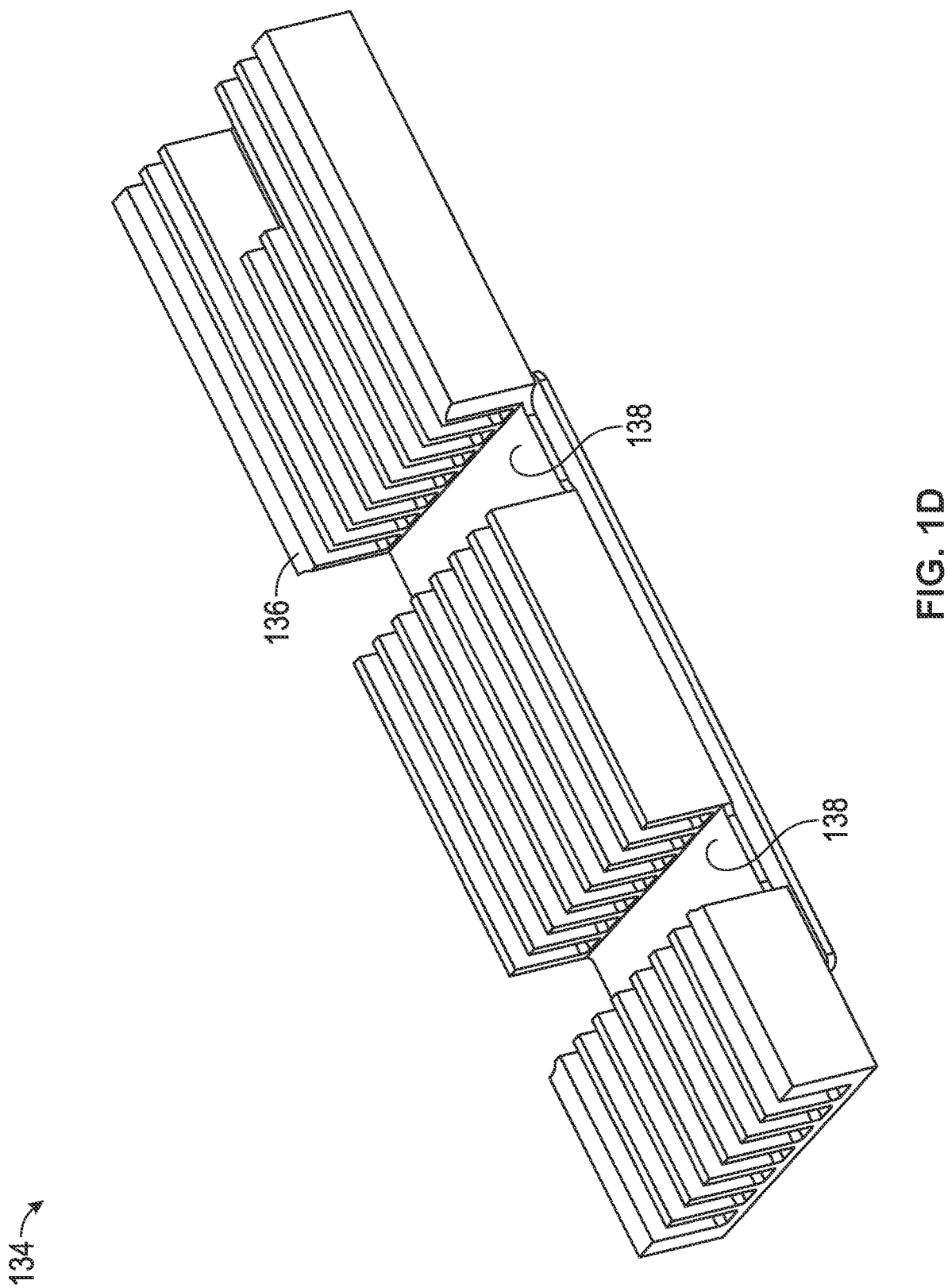
Figure 1E:
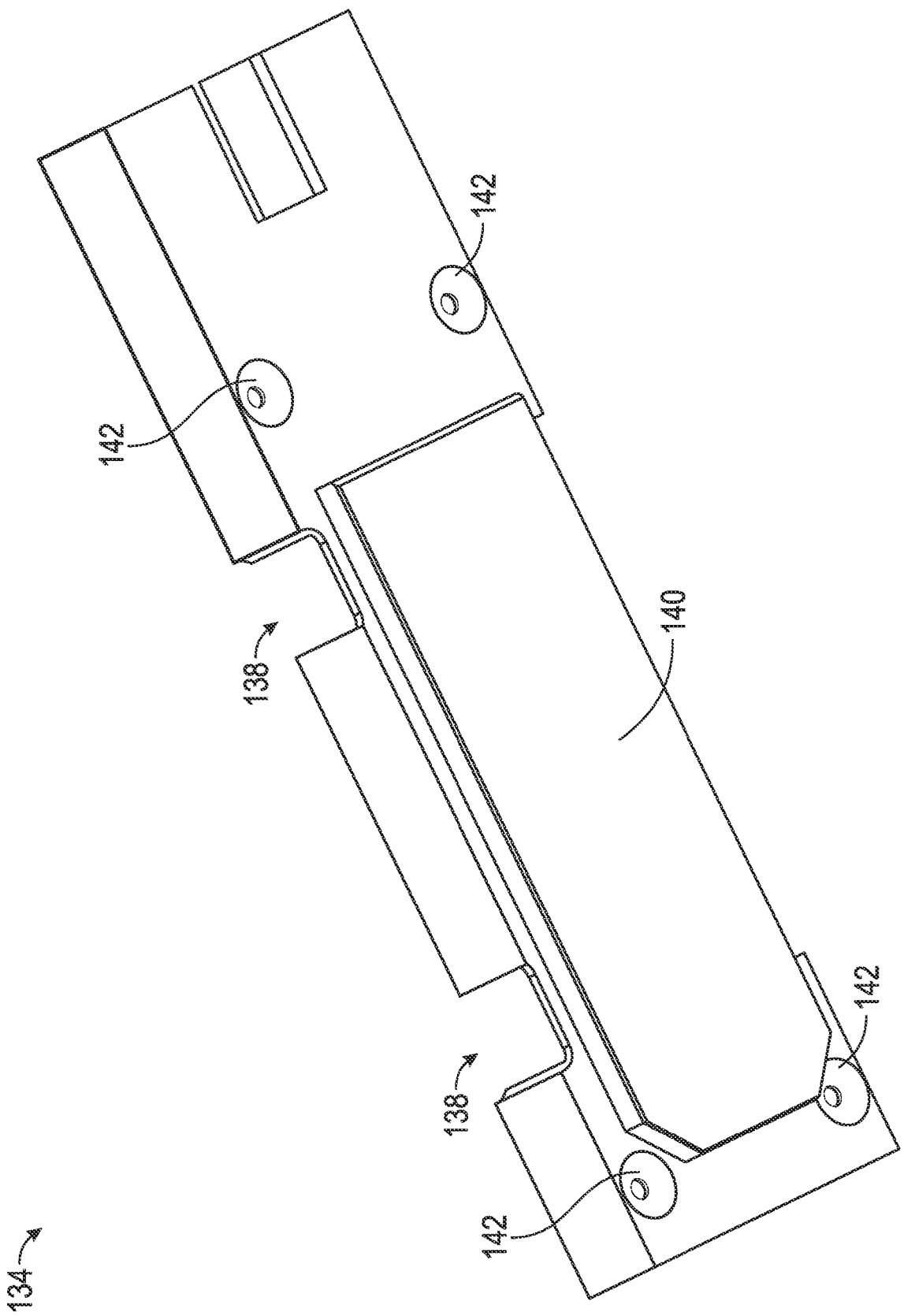
Figure 1F:
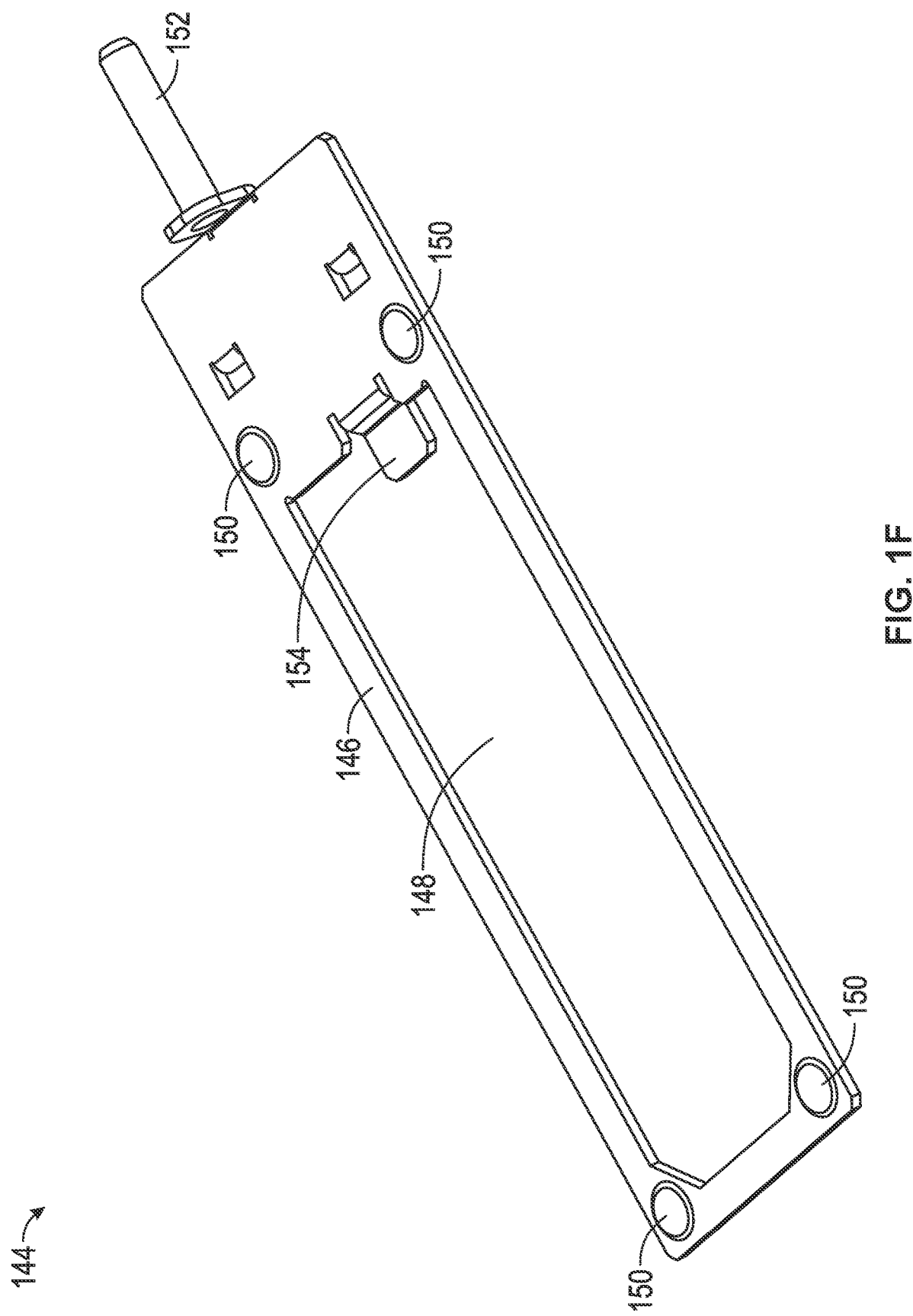

FIGS. 1A-1F are diagrams of an example system 100 associated with an actuating heatsink for pluggable modules. FIG. 1A is a perspective view of the system 100 including a frame 102 (sometimes referred to as a cage), a pluggable module 104 (e.g., an optical transceiver), a heatsink assembly 106, and a heatsink spring clip 108 movably coupling the heatsink assembly 106 to the frame 102. FIG. 1B is a perspective view of the frame 102 of the system 100. FIG. 1C is a perspective view of the pluggable module 104 of the system 100. FIGS. 1D and 1E are perspective views of a heatsink 134 of the heatsink assembly 106 of the system 100. And FIG. 1F is a perspective view of an actuator plate 144 of the heatsink assembly 106 of the system 100.

In some implementations, the example system 100 may be configured to be received within a data processing unit, such as a router, a switch, a server, and/or another network device. These devices are described in more detail below in connection with FIGS. 4-6. Additionally, or alternatively, in some implementations, the heatsink assembly 106 may be configured to actuate between a raised position, in which a clearance is provided between a heatsink of the heatsink assembly 106 and the pluggable module 104 as the pluggable module 104 is inserted and/or extracted from the frame 102, and a lowered position, in which the heatsink applies a positive pressure to the pluggable module 104 once the pluggable module 104 is fully inserted into the frame in order to transfer heat from the pluggable module 104 during operation.

More particularly, as best seen in FIG. 1B, the frame 102 may be a standard frame and/or cage used in data processing units or similar network devices, such as a frame and/or a cage conforming to a multi-source agreement (MSA) standard. An MSA standard may be a standard according to an agreement between multiple manufacturers to make products that have the same basic functionality and operability across different vendors. In some implementations, the frame 102 may correspond to an MSA electromagnetic interference (EMI) optical cage, which may be an MSA-compliant component configured to receive optical transceivers, among other pluggable modules. The frame 102 may include a main body 110, which may define one or more open, interior cavities for receiving one or more pluggable modules (e.g., one or more optical transceivers). For example, in the implementation depicted in FIG. 1B, the frame 102 includes a first interior cavity 112 and a second interior cavity 114, and thus the frame may be configured to receive two pluggable modules (e.g., two optical transceivers).

The frame 102 may include additional components and/or features configured to removably couple the frame 102 to other network components and/or portions of a data processing unit. For example, the frame 102 may include a panel interface 116, which may include multiple spring-loaded clips configured to removably couple the frame 102 to a panel of a data processing unit (e.g., a router, a switch, a server, a network rack, or a similar data processing unit). Additionally, or alternatively, the frame 102 may include one or more tabs 118 configured to couple a heatsink assembly (e.g., the heatsink assembly 106) or a portion thereof to the frame 102, which is described in more detail below in connection with FIG. 1F. Moreover, the frame 102 may include multiple spring latches 120, such as two spring latches 120 for each interior cavity 112, 114 provided therein. The spring latches 120 may be configured to removably secure a pluggable module (e.g., the pluggable module 104) within the frame 102 when the pluggable module is fully inserted into the frame 102. For example, the spring latches 120 may be configured to engage with an indentation or a similar receiving feature on the pluggable module 104 when the pluggable module 104 is fully inserted within the frame (as shown in FIG. 1A) in order to removably secure the pluggable module 104 within the frame 102.

As shown in FIG. 1C, the pluggable module 104 may be a module configured to plug into the frame 102, and, more particularly, may be a module configured to be removably received within an interior cavity 112, 114 of the frame 102. In some implementations, the pluggable module 104 may be an optical transceiver configured to enable an optical cable connection within a data processing unit (e.g., a router, a switch, a server, or a similar data processing unit) in which the frame 102 is housed, such as an MSA pluggable optical module or a similar module. In some implementations, the pluggable module 104 may be associated with a standardized form factor, such as a QSFP, an SFP, an OSFP, a CFP, or a similar standardized form factor. Additionally, or alternatively, the pluggable module 104 may configured to enable high-speed communications, such as communications associated with a high power consumption and/or a high bandwidth and which may thus generate high levels of heat during operation.

In some implementations, the pluggable module 104 may include a substantially rectangular-prism-shaped body 122 that includes an electrical connector 124 disposed at a first distal end thereof and a pull tab latch 126 disposed at a second, opposing distal end thereof. The electrical connector 124 may be configured to interact with a correspondingly sized and shaped electrical connector provided within a data processing unit that the pluggable module 104 is configured to plug into. The pull tab latch 126 may be configured to be grasped by a user during insertion or extraction of the pluggable module 104 from a data processing unit (e.g., from the frame 102 mounted within a data processing unit) in order to safely handle the pluggable module 104. The pluggable module 104 may include additional components configured to enable safe handling of the pluggable module 104, such as a release tab 128, which may be configured to de-latch the pluggable module 104 during an extraction process. More particularly, the release tab 128 may be configured to unseat the spring latches 120 of the frame 102 from corresponding indentations 129 provided on a side of the pluggable module 104 when a pulling force is applied to the release tab 128 during an extraction process.

In some implementations, the pluggable module 104 may include a substantially planar heat transfer surface 130, which may form part of a thermal interface between the pluggable module 104 and the heatsink assembly 106 when the pluggable module 104 is fully inserted and/or seated in the frame 102. Moreover, the body 122 may include one or more indents or other features which may be configured to engage with a portion of the heatsink assembly 106, thereby actuating the heatsink assembly 106 as the pluggable module 104 is inserted into the frame 102 (which is described in more detail in connection with FIGS. 3A-3D). More particularly, in the example depicted in FIG. 1C, the pluggable module 104 includes a shoulder 132, which may engage an engagement tab, trigger, tongue, or similar component of an actuator plate of the heatsink assembly 106 (discussed in more detail below in connection with FIG. 1D) during an insertion or extraction procedure.

As shown in the two perspective views included in FIGS. 1D and 1E, in some implementations, the heatsink assembly 106 may include a heatsink 134, sometimes referred to as a pedestal and/or a heatsink pedestal. The heatsink 134 may be formed from a metallic material or other material having a high thermal conductivity. The heatsink 134 may be configured to conduct heat away from a component of a data processing unit during operation of the component, such as the pluggable module 104 described in detail in connection with FIG. 1C. In that regard, the heatsink 134 may include a number of heat transfer fins 136 configured to dissipate heat through a convection process (e.g., the heat transfer fins 136 may be configured to dissipate heat to air flowing around the outer surfaces of the heat transfer fins 136). The heatsink 134 may further include one or more features configured to couple the heatsink 134 to other components of the heatsink assembly 106 and/or to the frame 102. For example, the heatsink may include a number of spring clip indents 138 or similar features configured to receive a spring clip or other biasing member, such as the heatsink spring clip 108 shown in FIG. 1A or a similar biasing member. As described above in connection with FIG. 1A, the heatsink spring clip 108 may in turn be configured to bias the heatsink toward an interior cavity 112, 114 of the frame 102 in order to forcibly engage (e.g., engage with a positive pressure) the heatsink 134 with the pluggable module 104 when the pluggable module 104 is plugged into the frame 102.

As best seen in the view included at FIG. 1E, the heatsink 134 may include a TIM 140, such as for purposes of reducing a thermal resistance at an interface between the heatsink 134 and the pluggable module 104. In that regard, the TIM 140 may include a material having high thermal conductivity properties to improve heat transfer at the thermal interface between the heatsink 134 and the pluggable module 104. In some implementations, the TIM 140 may include a compressible phase-change material (PCM) that is configured to be sandwiched between and/or compressed by the heatsink 134 and the pluggable module 104 when the heatsink 134 is in a deployed position (e.g., when the heatsink 134 is lowered such that the heatsink 134 makes forcible contact with the pluggable module 104, as is described in more detail in connection with FIGS. 3A-3D). Additionally, or alternatively, the TIM 140 may include a protective film layer in order to provide shear resistance and/or otherwise protect the TIM 140 from contact with the pluggable module 104, which is described in more detail below in connection with FIGS. 3A-3D. In some implementations, the TIM 140 may be, or may include, a polymer-based substrate, such as a polyimide (PI) based substrate or a similar substrate. Additionally, or alternatively, the TIM

140 may be, or may include, an RTM-X22™ pluggable phase change thermal pad made commercially available by Honeywell International Inc., and/or the TIM 140 may be, or may include, an OptiTIM™ thermal pad made commercially available by Laird Performance Materials.

In some implementations, the heatsink 134 may include one or more features associated with an actuator plate of the heatsink assembly 106, such as one or more receiving components 142 configured to receive one or more corresponding riser components of the actuator plate, which are described in more detail below in connection with FIGS. 3A-3D. In some implementations, such as the example shown in FIG. 1E, each of the receiving components 142 may be a countersunk hole provided in a surface of the heatsink 134 configured to receive a similarly sized and shaped dome component provided on an actuator plate, which is described in more detail below in connection with FIG. 1F. In some other implementations, the one or more receiving components 142 may be a notch or similar recess provided in a surface of the heatsink 134 configured to receive a similarly sized and shaped ramp or similar protrusion provided on an actuator plate, which is described in more detail below in connection with FIGS. 2A-2C.

As shown in FIG. 1F, the heatsink assembly 106 may further include an actuator plate 144. In some implementations, the actuator plate 144 may be configured to translate or otherwise move between an activated position, in order to lift the heatsink 134 away from the interior cavity 112, 114 and/or otherwise provide clearance between the heatsink 134 and the pluggable module 104 during insertion and extraction of the pluggable module 104 from the frame 102, and a deactivated position, in order to permit the heatsink 134 to forcibly contact the pluggable module 104 when the pluggable module 104 is fully inserted and/or plugged into the frame 102, thereby forming a thermal interface between the heatsink 134 and the pluggable module 104.

In some implementations, the actuator plate 144 may include a substantially planar body 146 having a TIM opening 148 provided in a central portion thereof. The TIM opening 148 may be a hole configured to surround and/or circumscribe the TIM 140 of the heatsink 134 with a sufficient clearance such that the TIM 140 may freely move therein from a lifted position to a dropped position, as is described in more detail below in connection with FIGS. 3A-3D. In some implementations, the actuator plate 144 may include one or more riser components 150, such as one or more dome components as shown in FIG. 1F. In some other implementations, the one or more riser components 150 may instead be ramps, protrusions, or similar components, which are described in more detail below in connection with FIGS. 2A-2C. The one or more riser components 150 may be configured to lift the heatsink 134 when the actuator plate 144 is in the activated position. Put another way, when the actuator plate 144 is in the activated position, the actuator plate 144 may be configured to apply a lifting force to the heatsink 134 that overcomes the biasing force applied by the heatsink spring clip 108 or a similar biasing member, thereby counteracting the biasing force and thus lifting the heatsink 134 away from the interior cavity 112, 114 of the frame 102.

Moreover, the one or more riser components 150 may be configured to be received within the one or more receiving components 142 of the heatsink 134 when the actuator plate 144 is in the deactivated position, thereby permitting the heatsink 134 to lower into the interior cavity 112, 114 of the frame. Put another way, when the actuator plate 144 is in the deactivated position with the riser components 150 thereof received in corresponding receiving components 142 of the heatsink 134, the actuator plate 144 may be configured to refrain from applying a lifting force to the heatsink 134, such that the biasing force applied by the heatsink spring clip 108 or similar biasing member moves the heatsink 134 toward the interior cavity 112, 114 of the frame 102 and thus causes the heatsink 134 to forcibly contact the pluggable module 104 within the frame 102. These features are described in more detail below in connection with FIGS. 3A-3D.

In some implementations, the actuator plate 144 may include one or more components configured to movably couple the actuator plate 144 to the frame 102. For example, the actuator plate 144 may include linkage 152, which may be a substantially cylindrical portion of the actuator plate 144 that is configured to be received via a clearance fit in a through hole of the tab 118 of the frame 102. In some implementations, the linkage 152 may include one more additional components, such as a biasing member (e.g., a coil spring, a leaf spring, or a similar biasing member), which is described in more detail below in connection with FIGS. 3A-3D. In such implementations, the biasing member may be configured to bias the actuator plate 144 into one of an activated position or a deactivated position. For example, the biasing member may be configured to bias the actuator plate 144 into the activated position in which it lifts the heatsink 134 up and out of the way of the pluggable module 104 as the pluggable module 104 is inserted into, or extracted from, the frame 102.

In some implementations, the actuator plate 144 may include an engagement tab 154 (sometimes referred to herein as a trigger and/or a tongue). The engagement tab 154 may be a portion of the actuator plate 144 that extends downward from the actuator plate 144 and thus into the interior cavity 112, 114 of the frame 102 when the heatsink assembly 106 is coupled to the frame 102 (e.g., when the heatsink assembly 106 is in the position shown in FIG. 1A). In this way, the engagement tab 154 may be configured to engage with a portion of the pluggable module 104 as the pluggable module 104 is plugged into the frame 102. For example, the engagement tab 154 may be configured to engage with the shoulder 132 of the pluggable module 104 as the pluggable module 104 is plugged into the frame 102, which is described in more detail below in connection with FIGS. 3A-3D.

As indicated above, FIGS. 1A-1F are provided as an example. Other examples may differ from what is described with regard to FIGS. 1A-1F. The number and arrangement of devices shown in FIGS. 1A-1F are provided as an example. In practice, there may be additional devices, fewer devices, different devices, or differently arranged devices than those shown in FIGS. 1A-1F. Furthermore, two or more devices shown in FIGS. 1A-1F may be implemented within a single device, or a single device shown in FIGS. 1A-1F may be implemented as multiple, distributed devices. Additionally, or alternatively, a set of devices (e.g., one or more devices) shown in FIGS. 1A-1F may perform one or more functions described as being performed by another set of devices shown in FIGS. 1A-1F.

Figure 2A:
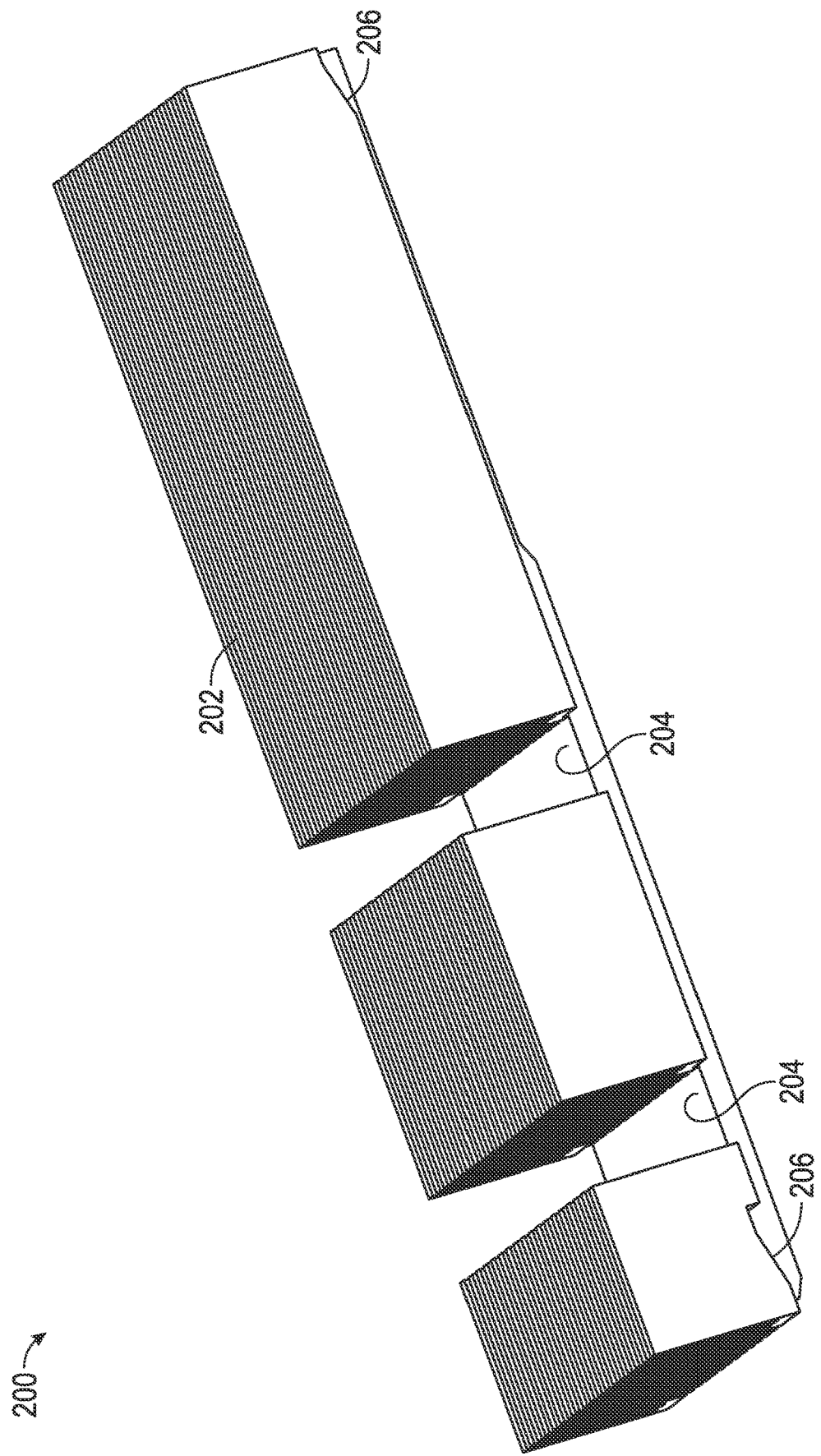
FIGS. 2A-2C are diagrams of another example heatsink and a corresponding actuator plate associated with an actuating heatsink for pluggable modules.
Figure 2B:
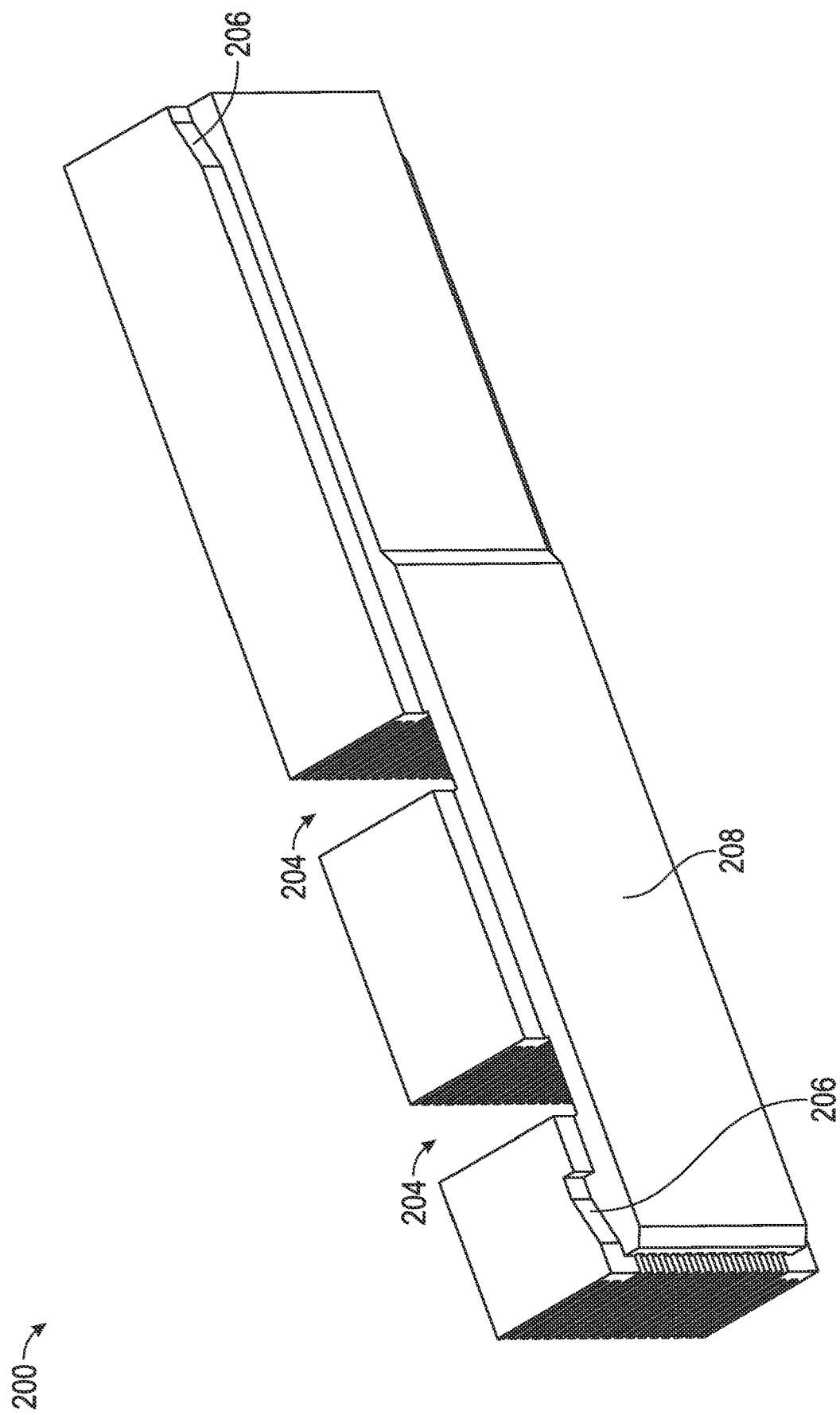
Figure 2C:
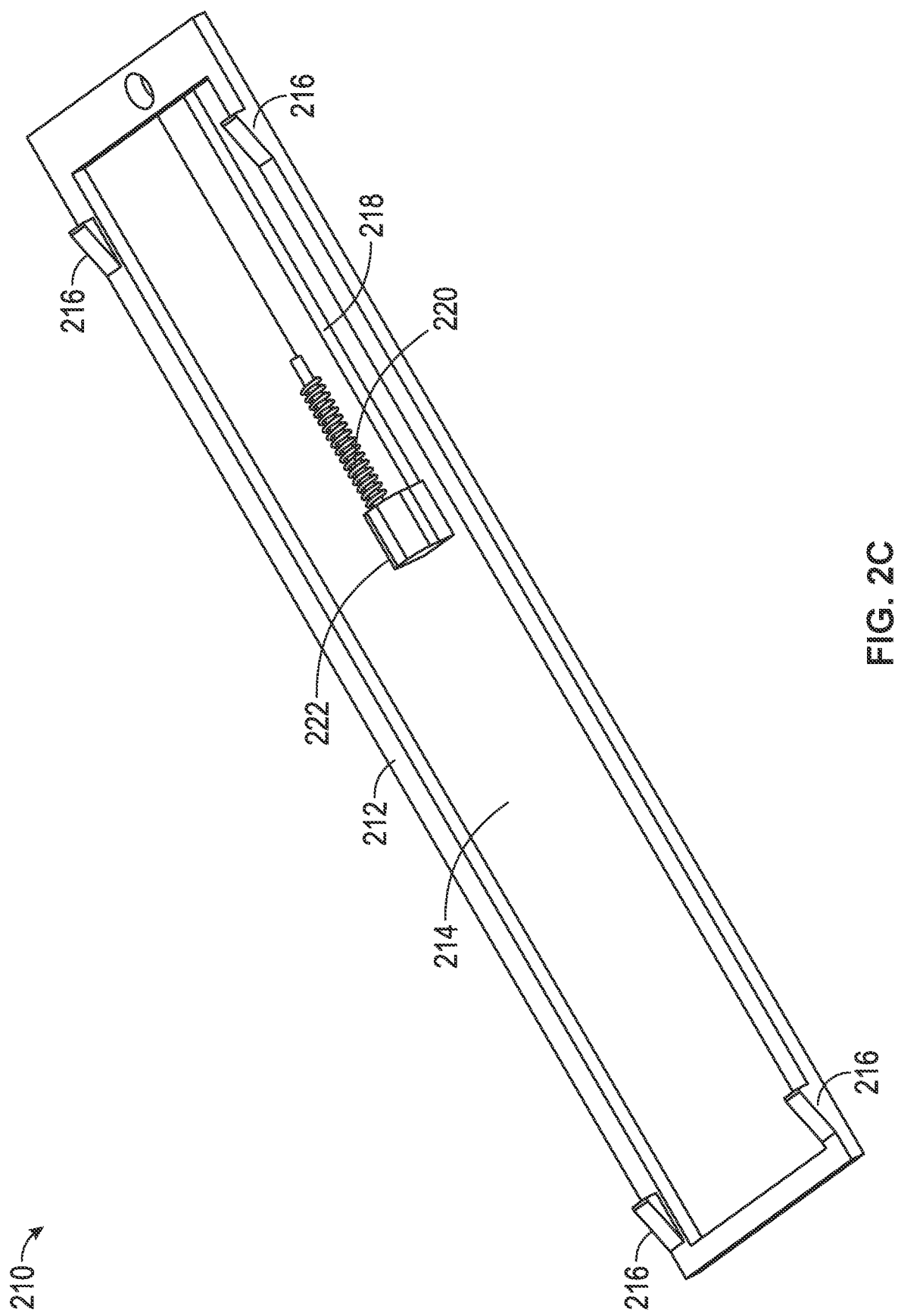

FIGS. 2A-2C are diagrams of another example heatsink 200 and a corresponding actuator plate 210 associated with an actuating heatsink for pluggable modules. FIGS. 2A and 2B show perspective views of the heatsink 200, which may form part of an actuating heatsink assembly, such as a heatsink assembly similar to the heatsink assembly 106 described above in connection with FIGS. 1A-1F. FIG. 2C shows a perspective view of the actuator plate 210, which may form part of an actuating heatsink assembly, such as a heatsink assembly similar to the heatsink assembly 106 described above in connection with FIGS. 1A-1F. In that regard, the example heatsink 200 and/or actuator plate 210 may be configured to be implemented in connection with a frame and/or cage (e.g., frame 102), a pluggable module (e.g., pluggable module 104), and/or a heatsink spring clip (e.g., heatsink spring clip 108), among other components.

In some implementations, the heatsink 200 and/or the actuator plate 210 may be configured to be received within a data processing unit, such as a router, a switch, a server, and/or another network device. These devices are described in more detail below in connection with FIGS. 4-6. Additionally, or alternatively, the heatsink 200 may be configured to actuate between a raised position, in which clearance is provided between the heatsink 200 and a pluggable module (e.g., pluggable module 104) as the pluggable module is inserted and/or extracted from a frame (e.g., frame 102), and a lowered position, in which the heatsink 200 applies a positive pressure to the pluggable module once the pluggable module is fully inserted into the frame in order to transfer heat from the pluggable module during operation, similar to the operation of the heatsink 134 and the actuator plate 144 described above in connection with FIGS. 1A-1F.

In this implementation, and as shown in the perspective views included in FIGS. 2A-2B, the heatsink 200 may include multiple heat transfer fins 202 and/or one or more spring clip indents 204, which may be substantially similar to the heat transfer fins 136 and the spring clip indents 138, respectively, described above in connection with the heatsink 134. Moreover, the heatsink 200 may include a TIM 208 configured to form a thermal interface between the heatsink 200 and a pluggable module (e.g., pluggable module 104), which may be substantially similar to the TIM 140 described above in connection with the heatsink 134.

In some implementations, the heatsink 200 may include one or more receiving components 206, which may operate in a manner substantially similar to the receiving components 142 described above in connection with the heatsink 134. However, in this implementation, rather than taking the form of a countersunk hole in a surface of the heatsink 200 (as was the case for the receiving components 142 of the heatsink 134), the receiving components 206 may be notches provided in the heatsink 200 that are configured to receive protrusions (e.g., ramps) provided on the actuator plate 210 when the actuator plate 210 is in the deactivated position.

More particularly, as shown in FIG. 2C, the actuator plate 210 may include a substantially planar main body 212, including a TIM opening 214 provided in a central portion thereof, which may be substantially similar to the body 146 and TIM opening 148 described above in connection with the actuator plate 144. In this implementation, however, the actuator plate 210 includes multiple riser components 216, which may be ramped portions of the actuator plate 210. The riser components 216 (e.g., the ramped portions) may be configured to lift the heatsink 200 away from an open interior cavity of a frame (e.g., frame 102) when the actuator plate 210 is in the activated position (thereby permitting insertion and extraction of a pluggable module without the module contacting the heatsink 200 and/or TIM 208 thereof) and/or the riser components 216 may be configured to be received with the receiving components 206 (e.g., notches) provided in the heatsink 200 when the actuator plate 210 is in the deactivated position (thereby permitting contact between the heatsink 200 and the pluggable module, forming a thermal interface at the TIM 208).

In some implementations, the actuator plate 210 may further include linkage 218, which may movably couple the actuator plate to a frame (e.g., frame 102). As shown, the linkage 218 may include a biasing member 220 (e.g., a coil spring in the example shown in FIG. 2C), which may extend between the frame and the actuator plate 210 and thereby bias the actuator plate 210 toward the activated position when the actuator plate 210 is not otherwise in contact with a pluggable module. Moreover, the actuator plate 210 may include an engagement tab 222 (e.g., a tongue and/or a trigger), which may be configured to contact a portion of a pluggable module (e.g., the shoulder 132 of the pluggable module 104), thereby translating to the deactivated position in a similar manner as described above in connection with the actuator plate 144, and as further described below in connection with FIGS. 3A-3D.

As indicated above, FIGS. 2A-2C are provided as an example. Other examples may differ from what is described with regard to FIGS. 2A-2C. The number and arrangement of devices shown in FIGS. 2A-2C are provided as an example. In practice, there may be additional devices, fewer devices, different devices, or differently arranged devices than those shown in FIGS. 2A-2C. Furthermore, two or more devices shown in FIGS. 2A-2C may be implemented within a single device, or a single device shown in FIGS. 2A-2C may be implemented as multiple, distributed devices. Additionally, or alternatively, a set of devices (e.g., one or more devices) shown in FIGS. 2A-2C may perform one or more functions described as being performed by another set of devices shown in FIGS. 2A-2C.

Figure 3A:
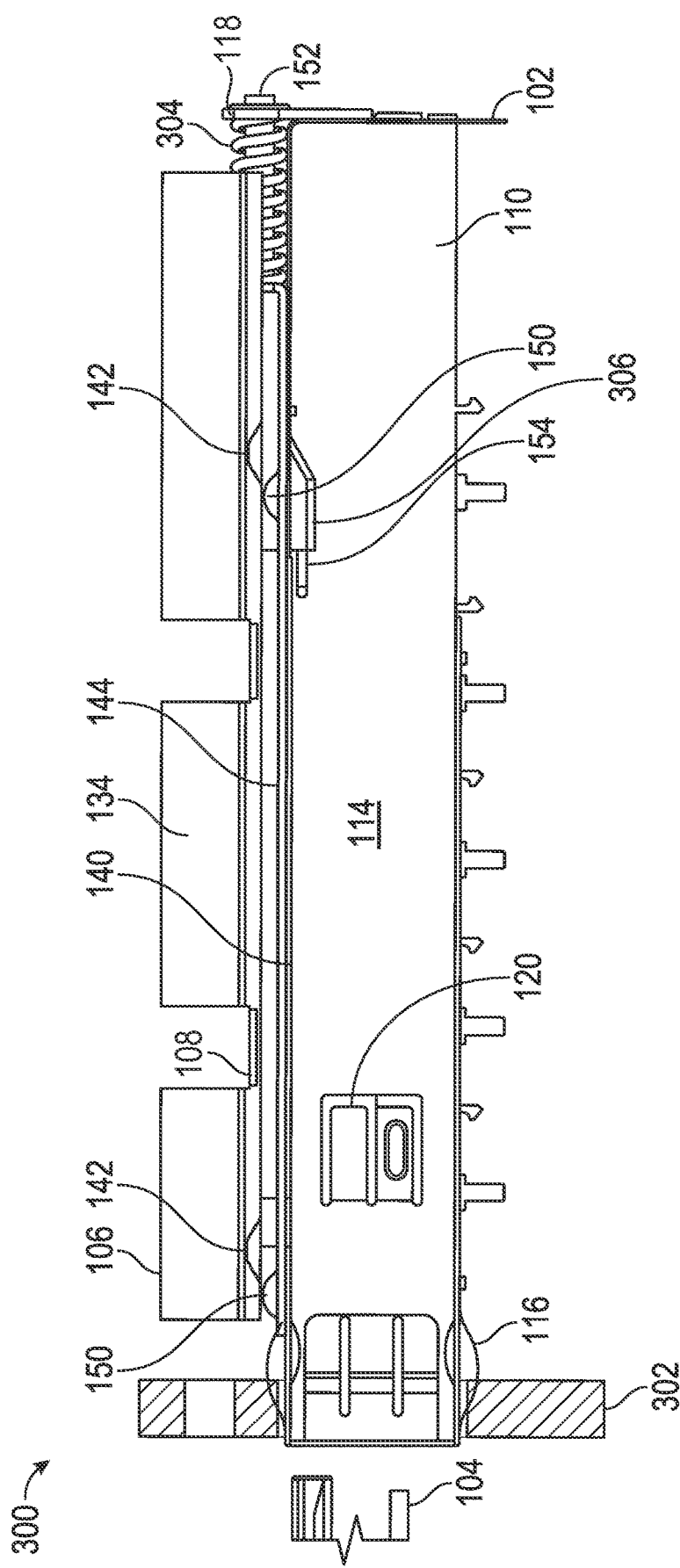
FIGS. 3A-3D are diagrams of an example implementation associated with an actuating heatsink for pluggable modules.
Figure 3B:
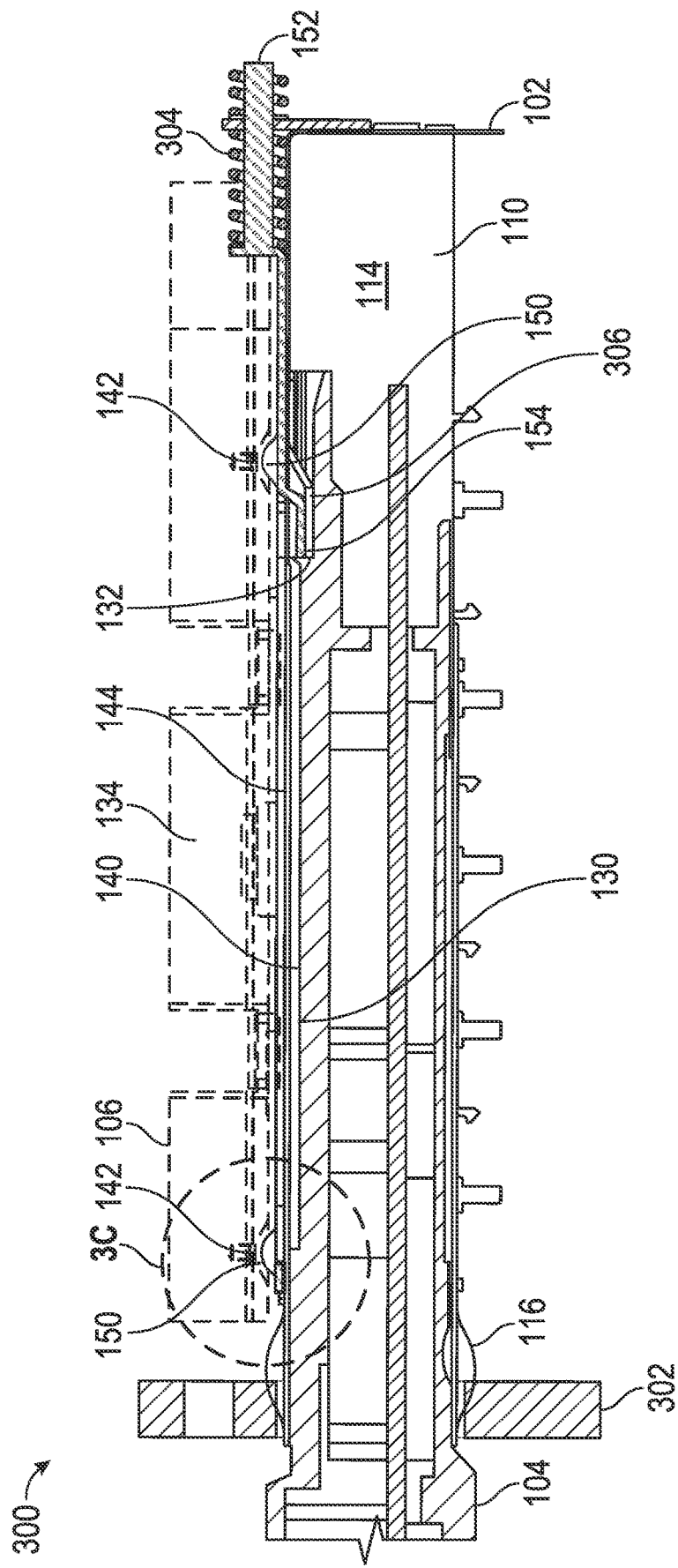
Figure 3C:
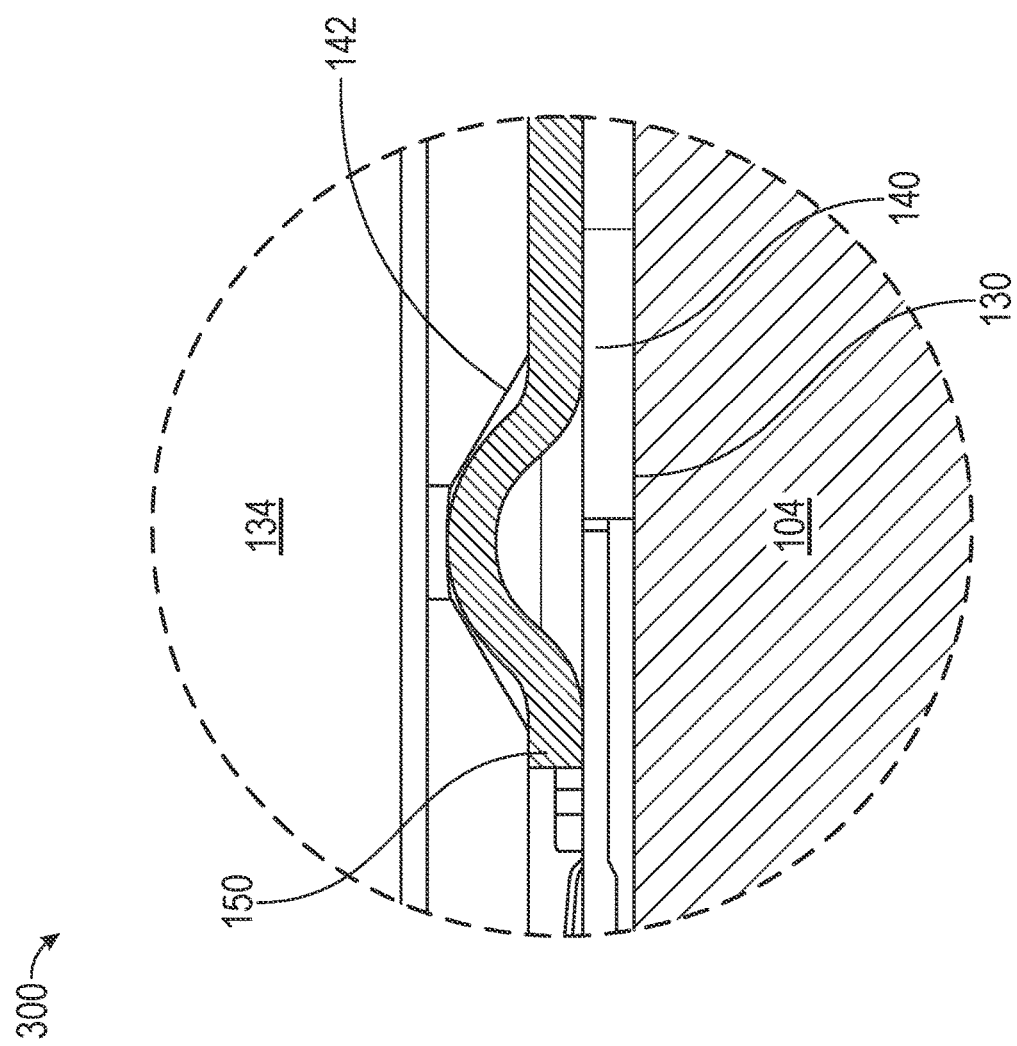
Figure 3D:
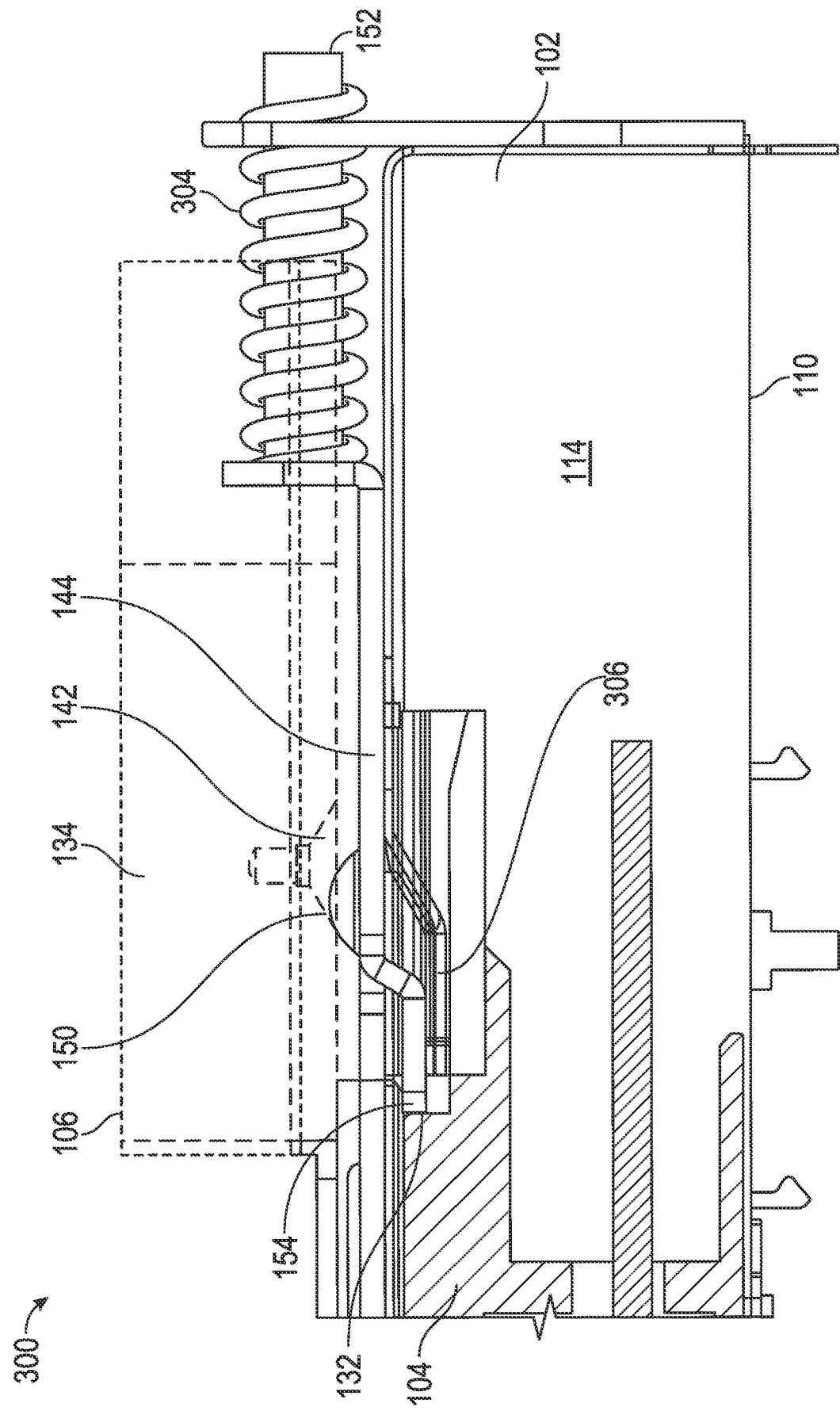

FIGS. 3A-3D are diagrams of an example implementation 300 associated with an actuating heatsink for pluggable modules. FIG. 3A is a cross-sectional view of the system 100 shown in FIGS. 1A-1F in a state in which the pluggable module 104 is removed from the frame 102. FIG. 3B is a cross-sectional view of the system 100 shown in FIGS. 1A-1F in a state in which the pluggable module 104 is fully inserted into and/or seated within the frame 102. FIG. 3C is closeup view of a portion of the cross-sectional view shown in FIG. 3B. FIG. 3D is a partial, cross-section view of the system 100 shown in FIGS. 1A-1F in a state in which the pluggable module 104 is partially removed from the frame 102 but still in contact with the engagement tab 154. Although the example implementation 300 is described in connection with the system 100 described above in connection with FIGS. 1A-1F, in other implementations a different system and/or different devices than those described above in connection with FIGS. 1A-1F may be employed to perform a substantially similar example implementation. For example, in some implementations, a system employing the heatsink 200 and/or the actuator plate 210 described above in connection with FIGS. 2A-2C may be used in a similar manner. In some implementations, the example implementation 300 may be associated with the devices described in more detail below in connection with FIGS. 4-6.

As shown in FIG. 3A, in some implementations, the system 100 may be implemented in a data processing unit (e.g., a router, a switch, a server, or a similar device), such as by installing the frame 102 in a panel 302 associated with a data processing unit. More particularly, the frame 102 may inserted into an opening in the panel 302 associated with the data processing unit and/or may be secured thereto via the panel interface 116 (e.g., spring clips) of the frame 102. Moreover, the heatsink assembly 106 may be movably coupled to the frame 102 and/or biased toward the interior cavity 114 of the frame 102, such as via the heatsink spring clip 108 or a similar biasing member.

In the state shown in FIG. 3A, the pluggable module 104 is removed from the frame 102. In such implementations, the actuator plate 144 may be in an activated position, in which the actuator plate 144 applies a lifting force to the heatsink 134 that overcomes the biasing force of the heatsink spring clip 108 or similar biasing member, thereby lifting the heatsink 134 out of the interior cavity 114 and providing an open channel for receiving the pluggable module 104 without interaction with the heatsink 134. More particularly, in the activated position, the riser components 150 of the actuator plate 144 may contact a bottom surface of the heatsink 134 and force the heatsink 134 upward (e.g., away from the interior cavity 114). In some implementations, a biasing member 304 (e.g., a coil spring) may be disposed between the actuator plate 144 and the frame 102 (e.g., the tab 118 of the frame 102), thereby applying a biasing force to the actuator plate 144 that causes the actuator plate 144 to translate toward the panel 302 and thus lift the heatsink 134 out of the interior cavity 114, as shown in FIG. 3A.

As described above in connection with FIGS. 1A-1F, the actuator plate 144 may include a TIM opening 148 that circumscribes the TIM 140 of the heatsink 134 and thus permits the TIM 140 to translate, in an up-and-down direction as viewed in FIG. 3A, within the TIM opening 148. In this regard, when the actuator plate 144 is in the activated position, a lowermost surface of the heatsink (e.g., a lowermost surface of the TIM 140) may be substantially aligned with a top of the main body 110 of the frame 102 and/or may only extend below the top of the main body 110 of the frame 102 a minimal amount such that the TIM 140 does not impede an open channel formed in the interior cavity 114 for receiving the pluggable module 104.

Moreover, as shown in FIG. 3A, in the activated position the engageable tab 154 of the actuator plate 144 may extend into the interior cavity 114 such that the engageable tab 154 is within the open channel configured to receive the pluggable module 104. Additionally, the engagement tab 154 may extend forward of (e.g., toward the panel 302) a seat 306 formed in the frame 102, which may be a component of the frame 102 configured to engage the pluggable module 104 (e.g., the shoulder 132 of the pluggable module 104) when the pluggable module 104 is fully inserted into the frame 102. In this regard, the engagement tab 154 may be configured to engage with the pluggable module 104 (more particularly, the shoulder 132 of the pluggable module 104) as the pluggable module 104 is inserted into and/or extracted from the frame 102. This may be more readily understood with reference to FIG. 3B, which shows the pluggable module 104 in a fully inserted state.

More particularly, as shown in FIG. 3B, the pluggable module 104 may be plugged into the frame 102 by sliding the pluggable module 104 into the interior cavity 114 until the electrical connector 124 of the pluggable module 104 engages with a corresponding electrical connector of the data processing unit, until a latch (e.g., spring latch 120) on the frame 102 engages with a corresponding indentation 129 or similar catch on the pluggable module 104, and/or until the pluggable module 104 (more particularly, the shoulder 132 of the pluggable module 104) engages with the seat 306 of the frame 102. Because the engageable tab 154 extends into the channel that receives the pluggable module 104, as the pluggable module 104 is inserted into the frame 102, the pluggable module 104 may contact the engageable tab 154 and push the engageable tab 154 (and thus the actuator plate) backward (e.g., away from the panel 302, toward the right in the view shown in FIGS. 3A and 3C). In implementations including the biasing member 304, pushing the engagement tab 154 away from the panel 302 may compress the biasing member 304 and/or otherwise overcome a biasing force applied to the actuator plate 144 by the biasing member 304. This may cause the actuator plate 144 to translate from the activated position (as shown in FIG. 3A) to the deactivated position (as shown in FIG. 3B).

Moreover, when the actuator plate 144 is in the deactivated position, each of the riser components 150 of the actuator plate 144 may align with and/or may be received by a corresponding one of the receiving components 142 of the heatsink 134. More particularly, each riser component 150 may be received within a corresponding receiving component 142, as best seen in the partial closeup view provided in FIG. 3C. Because, in this state, the riser components 150 are no longer in contact with a bottom surface of the heatsink 134 but instead are received within the receiving components 142, a biasing force applied by the heatsink spring clip 108 or a similar component may bias the heatsink 134 downward until the heatsink 134 forcibly contacts the pluggable module 104 and/or until the receiving components 142 are seated about the riser components 150. More particularly, the TIM 140 may extend through the TIM opening 148 in the actuator plate 144 and forcibly contact the heat transfer surface 130 of the pluggable module 104, forming a thermal interface between the heatsink 134 and the pluggable module 104. In some implementations, such as in implementations in which the TIM 140 is associated with a compressible PCM, when the pluggable module 104 is fully inserted within the frame 102 (as shown in FIGS. 3B and 3C), the TIM 140 may be compressed between the heatsink 134 and the pluggable module 104. This may form a more effective thermal interface than the metal-to-metal contact formed between traditional heatsinks and pluggable modules. Put another way, the compressed TIM 140 between the heatsink 134 and the pluggable module 104 may form a thermal interface having a lower heat transfer resistance than a heat transfer resistance of a metal-to-metal thermal interface formed between traditional heatsinks and pluggable modules.

In some implementations, in order to avoid rubbing of the TIM 140 on the pluggable module 104 as the pluggable module 104 is extracted from the frame 102, the actuator plate 144 may be configured to translate from the deactivated position to the activated position, thereby lifting the heatsink 134 away from the pluggable module 104, as the pluggable module 104 is being removed from the frame 102. More particularly, as shown in the closeup view provided in FIG. 3D, as the pluggable module 104 is being removed (e.g., as the pluggable module 104 moves to the left in the view shown in FIG. 3D), the biasing force provided by the biasing member 304 may force the actuator plate 144 toward the activated position (e.g., the biasing force may press the engagement tab 154 against the shoulder 132 such that the actuator plate 144 translates with the pluggable module 104 as the pluggable module 104 is being removed). Moreover, as the actuator plate 144 translates from the deactivated position to the activated position, the riser components 150 may impart a lifting force on the heatsink 134, first via interaction of the riser components 150 with the interior surfaces of the receiving components 142 (as shown in FIG. 3D) and then via interaction of the riser components 150 with a bottom surface of the heatsink 134 (in a similar manner as shown in FIG. 3A). In response, the heatsink 134 may rise (e.g., move upward in the view shown in FIG. 3D), with the TIM 140 rising upward through the TIM opening 148 in the actuator plate 144, thereby vacating the interior cavity 114 and thus providing clearance between the heatsink 134 (e.g., the TIM 140 of the heatsink 134) and the pluggable module 104 as the pluggable module 104 is removed from the frame 102.

Based on the actuator plate 144 translating from the activated position, in which the actuator plate 144 lifts the heatsink 134 away from the pluggable module 104, to the deactivated position, in which the actuator plate 144 permits the heatsink 134 to engage the pluggable module 104, as the pluggable module 104 is inserted into and/or extracted from the frame 102, rubbing between the heatsink 134 and the pluggable module 104 may be reduced or eliminated, thereby permitting the use of the TIM 140 or a similar material at a thermal interface between the heatsink 134 and the pluggable module 104. As a result, a useful life of the heatsink 134 may be increased, because wear caused by rubbing of the heatsink 134 and the pluggable module 104 may be reduced or eliminated. Moreover, because in such implementations the TIM 140 or similar material may be employed to lower a thermal resistance at a thermal interface between the heatsink 134 and the pluggable module 104 and thereby improve the heat transfer capabilities of the heatsink assembly 106, high-power and/or high-bandwidth pluggable modules 104 may be employed in a data processing unit, increasing performance of various network devices.

As indicated above, FIGS. 3A-3D are provided as an example. Other examples may differ from what is described with regard to FIGS. 3A-3D. The number and arrangement of devices shown in FIGS. 3A-3D are provided as an example. In practice, there may be additional devices, fewer devices, different devices, or differently arranged devices than those shown in FIGS. 3A-3D. Furthermore, two or more devices shown in FIGS. 3A-3D may be implemented within a single device, or a single device shown in FIGS. 3A-3D may be implemented as multiple, distributed devices. Additionally, or alternatively, a set of devices (e.g., one or more devices) shown in FIGS. 3A-3D may perform one or more functions described as being performed by another set of devices shown in FIGS. 3A-3D.

Figure 4:
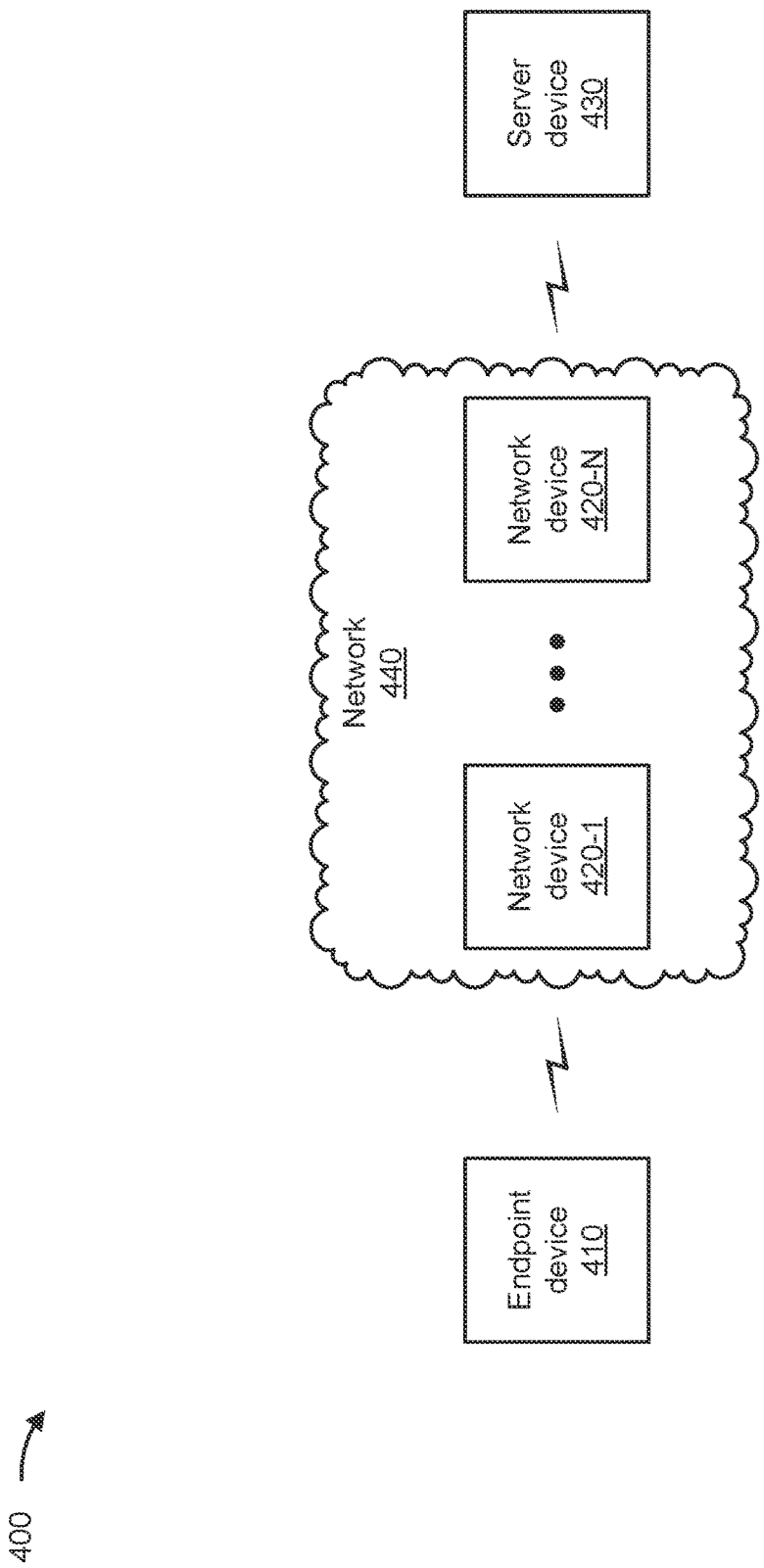
FIG. 4 is a diagram of an example environment in which systems and/or methods described herein may be implemented.

FIG. 4 is a diagram of an example environment 400 in which systems and/or methods described herein may be implemented. As shown in FIG. 4, environment 400 may include an endpoint device 410, a group of network devices 420 (shown as network device 420-1 through network device 420-N), a server device 430, and a network 440. Devices of environment 400 may interconnect via wired connections, wireless connections, or a combination of wired and wireless connections.

Endpoint device 410 includes one or more devices capable of receiving, generating, storing, processing, and/or providing information, such as information described herein. For example, endpoint device 410 may include a mobile phone (e.g., a smart phone or a radiotelephone), a laptop computer, a tablet computer, a desktop computer, a handheld computer, a gaming device, a wearable communication device (e.g., a smart watch, a pair of smart glasses, a heart rate monitor, a fitness tracker, smart clothing, smart jewelry, or a head mounted display), a network device, or a similar type of device. In some implementations, endpoint device 410 may receive network traffic from and/or may provide network traffic to other endpoint devices 410 and/or server device 430, via network 440 (e.g., by routing packets using network devices 420 as intermediaries).

Network device 420 includes one or more devices capable of receiving, processing, storing, routing, and/or providing traffic (e.g., a packet or other information or metadata) in a manner described herein. For example, network device 420 may include a router, such as a label switching router (LSR), a label edge router (LER), an ingress router, an egress router, a provider router (e.g., a provider edge router or a provider core router), a virtual router, or another type of router. Additionally, or alternatively, network device 420 may include a gateway, a switch, a firewall, a hub, a bridge, a reverse proxy, a server (e.g., a proxy server, a cloud server, or a data center server), a load balancer, and/or a similar device. In some implementations, network device 420 may be a physical device implemented within a housing, such as a chassis. In some implementations, network device 420 may be a virtual device implemented by one or more computer devices of a cloud computing environment or a data center. In some implementations, a group of network devices 420 may be a group of data center nodes that are used to route traffic flow through network 440.

Server device 430 includes one or more devices capable of receiving, generating, storing, processing, and/or providing information, such as information described herein. For example, server device 430 may include a laptop computer, a tablet computer, a desktop computer, a group of server devices, or a similar type of device, associated with multicast traffic. In some implementations, server device 430 may receive information from and/or transmit information (e.g., multicast traffic) to endpoint device 410, via network 440 (e.g., by routing packets using network devices 420 as intermediaries).

Network 440 includes one or more wired and/or wireless networks. For example, network 440 may include a packet switched network, a cellular network (e.g., a fifth generation (5G) network, a fourth generation (4G) network, such as a long-term evolution (LTE) network, a third generation (3G) network, a code division multiple access (CDMA) network, a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 4 are provided as an example. In practice, there may be additional devices and/or networks, fewer devices and/or networks, different devices and/or networks, or differently arranged devices and/or networks than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
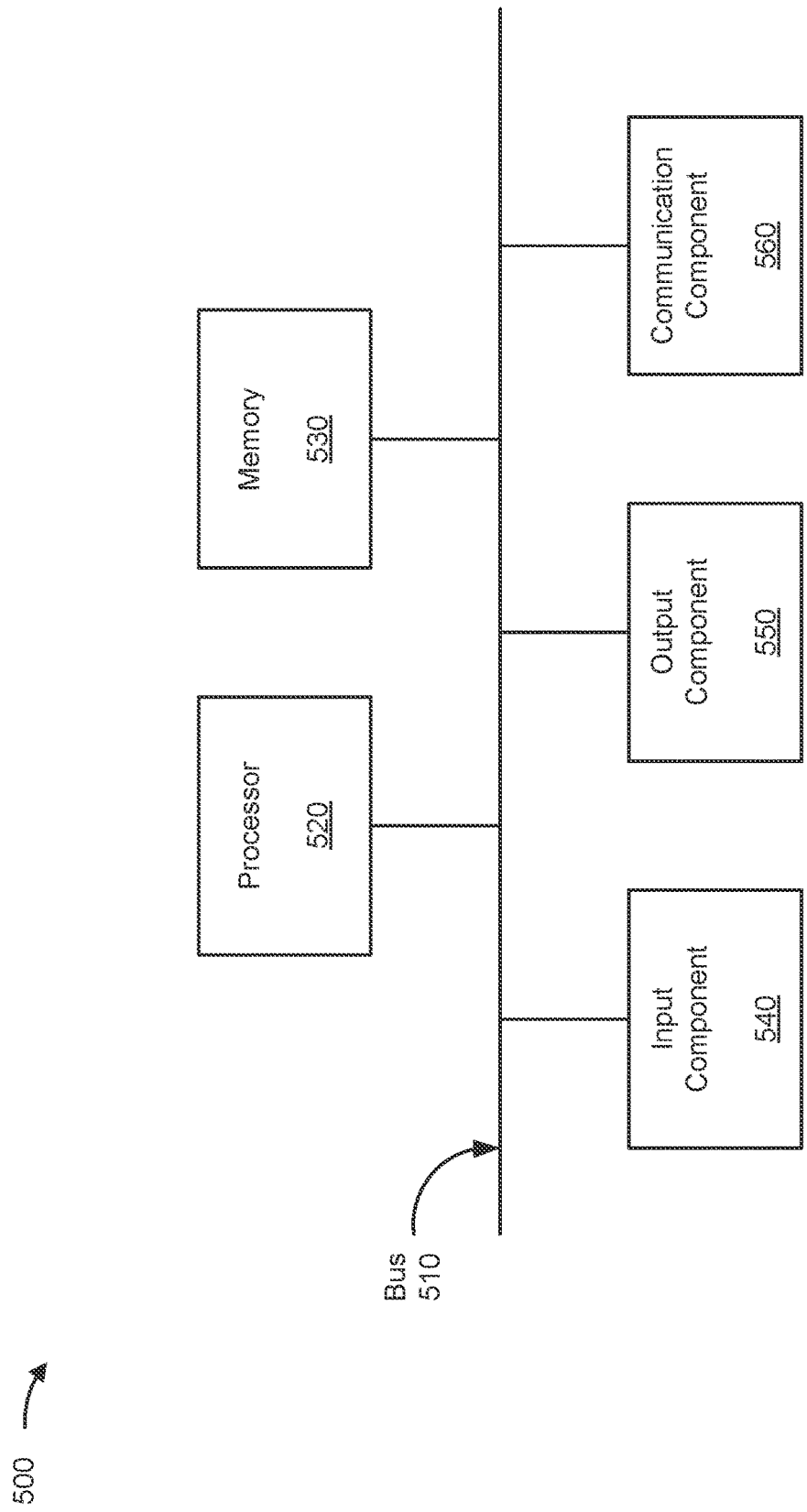
FIG. 5 is a diagram of example components of a device associated with an actuating heatsink for pluggable modules.

FIG. 5 is a diagram of example components of a device 500 associated with an actuating heatsink for pluggable modules. The device 500 may correspond to a data processing unit or similar device configured to interact with the system 100, the heatsink 200, the actuator plate 210, and/or similar frames, pluggable modules (e.g., optical transceivers), heatsink assemblies, and/or other network components. As shown in FIG. 5, the device 500 may include a bus 510, a processor 520, a memory 530, an input component 540, an output component 550, and/or a communication component 560.

The bus 510 may include one or more components that enable wired and/or wireless communication among the components of the device 500. The bus 510 may couple together two or more components of FIG. 5, such as via operative coupling, communicative coupling, electronic coupling, and/or electric coupling. For example, the bus 510 may include an electrical connection (e.g., a wire, a trace, and/or a lead) and/or a wireless bus. The processor 520 may include a central processing unit, a graphics processing unit, a microprocessor, a controller, a microcontroller, a digital signal processor, a field-programmable gate array, an application-specific integrated circuit, and/or another type of processing component. The processor 520 may be implemented in hardware, firmware, or a combination of hardware and software. In some implementations, the processor 520 may include one or more processors capable of being programmed to perform one or more operations or processes described elsewhere herein.

The memory 530 may include volatile and/or nonvolatile memory. For example, the memory 530 may include random access memory (RAM), read only memory (ROM), a hard disk drive, and/or another type of memory (e.g., a flash memory, a magnetic memory, and/or an optical memory). The memory 530 may include internal memory (e.g., RAM, ROM, or a hard disk drive) and/or removable memory (e.g., removable via a universal serial bus connection). The memory 530 may be a non-transitory computer-readable medium. The memory 530 may store information, one or more instructions, and/or software (e.g., one or more software applications) related to the operation of the device 500. In some implementations, the memory 530 may include one or more memories that are coupled (e.g., communicatively coupled) to one or more processors (e.g., processor 520), such as via the bus 510. Communicative coupling between a processor 520 and a memory 530 may enable the processor 520 to read and/or process information stored in the memory 530 and/or to store information in the memory 530.

The input component 540 may enable the device 500 to receive input, such as user input and/or sensed input. For example, the input component 540 may include a touch screen, a keyboard, a keypad, a mouse, a button, a microphone, a switch, a sensor, a global positioning system sensor, an accelerometer, a gyroscope, and/or an actuator. The output component 550 may enable the device 500 to provide output, such as via a display, a speaker, and/or a light-emitting diode. The communication component 560 may enable the device 500 to communicate with other devices via a wired connection and/or a wireless connection. For example, the communication component 560 may include a receiver, a transmitter, a transceiver, a modem, a network interface card, and/or an antenna.

The device 500 may perform one or more operations or processes described herein. For example, a non-transitory computer-readable medium (e.g., memory 530) may store a set of instructions (e.g., one or more instructions or code) for execution by the processor 520. The processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, the processor 520 may be configured to perform one or more operations or processes described herein. Thus, implementations described herein are not limited to any specific combination of hardware circuitry and software.

The number and arrangement of components shown in FIG. 5 are provided as an example. The device 500 may include additional components, fewer components, different components, or differently arranged components than those shown in FIG. 5. Additionally, or alternatively, a set of components (e.g., one or more components) of the device 500 may perform one or more functions described as being performed by another set of components of the device 500.

Figure 6:
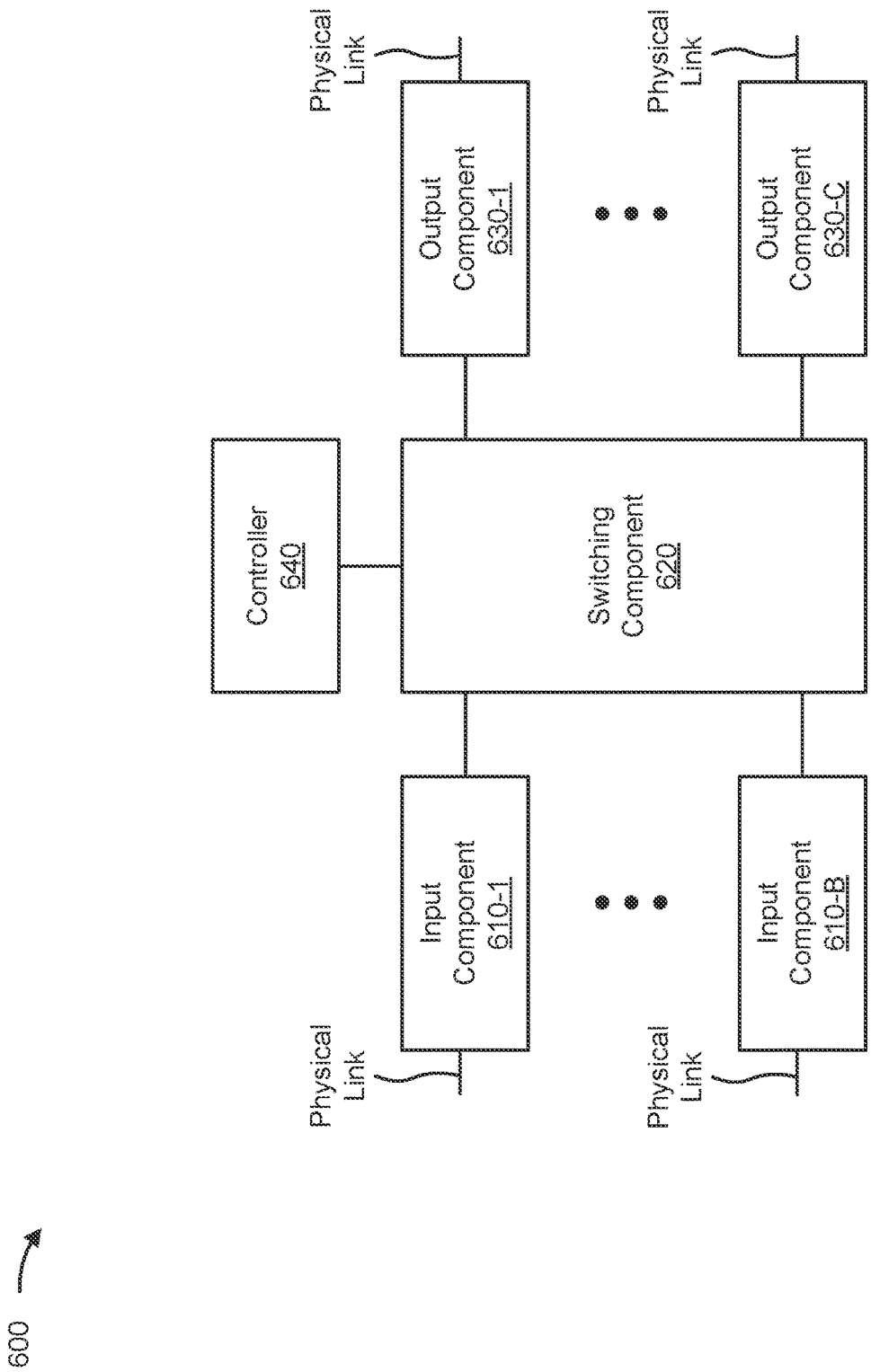
FIG. 6 is another diagram of example components of a device associated with an actuating heatsink for pluggable modules.

FIG. 6 is a diagram of example components of a device 600 associated with an actuating heatsink for pluggable modules. Device 600 may correspond to a data processing unit or similar device configured to interact with the system 100, the heatsink 200, the actuator plate 210, and/or similar frames, pluggable modules (e.g., optical transceivers), heatsink assemblies, and/or other network components. As shown in FIG. 6, device 600 may include one or more input components 610-1 through 610-B (B≥1) (hereinafter referred to collectively as input components 610, and individually as input component 610), a switching component 620, one or more output components 630-1 through 630-C (C≥1) (hereinafter referred to collectively as output components 630, and individually as output component 630), and a controller 640.

Input component 610 may be one or more points of attachment for physical links and may be one or more points of entry for incoming traffic, such as packets. Input component 610 may process incoming traffic, such as by performing data link layer encapsulation or decapsulation. In some implementations, input component 610 may transmit and/or receive packets. In some implementations, input component 610 may include an input line card that includes one or more packet processing components (e.g., in the form of integrated circuits), such as one or more interface cards (IFCs), packet forwarding components, line card controller components, input ports, processors, memories, and/or input queues. In some implementations, device 600 may include one or more input components 610.

Switching component 620 may interconnect input components 610 with output components 630. In some implementations, switching component 620 may be implemented via one or more crossbars, via busses, and/or with shared memories. The shared memories may act as temporary buffers to store packets from input components 610 before the packets are eventually scheduled for delivery to output components 630. In some implementations, switching component 620 may enable input components 610, output components 630, and/or controller 640 to communicate with one another.

Output component 630 may store packets and may schedule packets for transmission on output physical links. Output component 630 may support data link layer encapsulation or decapsulation, and/or a variety of higher-level protocols. In some implementations, output component 630 may transmit packets and/or receive packets. In some implementations, output component 630 may include an output line card that includes one or more packet processing components (e.g., in the form of integrated circuits), such as one or more IFCs, packet forwarding components, line card controller components, output ports, processors, memories, and/or output queues. In some implementations, device 600 may include one or more output components 630. In some implementations, input component 610 and output component 630 may be implemented by the same set of components (e.g., and input/output component may be a combination of input component 610 and output component 630).

Controller 640 includes a processor in the form of, for example, a CPU, a GPU, an APU, a microprocessor, a microcontroller, a DSP, an FPGA, an ASIC, and/or another type of processor. The processor is implemented in hardware, firmware, or a combination of hardware and software. In some implementations, controller 640 may include one or more processors that can be programmed to perform a function.

In some implementations, controller 640 may include a RAM, a ROM, and/or another type of dynamic or static storage device (e.g., a flash memory, a magnetic memory, an optical memory, etc.) that stores information and/or instructions for use by controller 640.

In some implementations, controller 640 may communicate with other devices, networks, and/or systems connected to device 600 to exchange information regarding network topology. Controller 640 may create routing tables based on the network topology information, may create forwarding tables based on the routing tables, and may forward the forwarding tables to input components 610 and/or output components 630. Input components 610 and/or output components 630 may use the forwarding tables to perform route lookups for incoming and/or outgoing packets.

Controller 640 may perform one or more processes described herein. Controller 640 may perform these processes in response to executing software instructions stored by a non-transitory computer-readable medium. A computer-readable medium is defined herein as a non-transitory memory device. A memory device includes memory space within a single physical storage device or memory space spread across multiple physical storage devices.

Software instructions may be read into a memory and/or storage component associated with controller 640 from another computer-readable medium or from another device via a communication interface. When executed, software instructions stored in a memory and/or storage component associated with controller 640 may cause controller 640 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 6 are provided as an example. In practice, device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
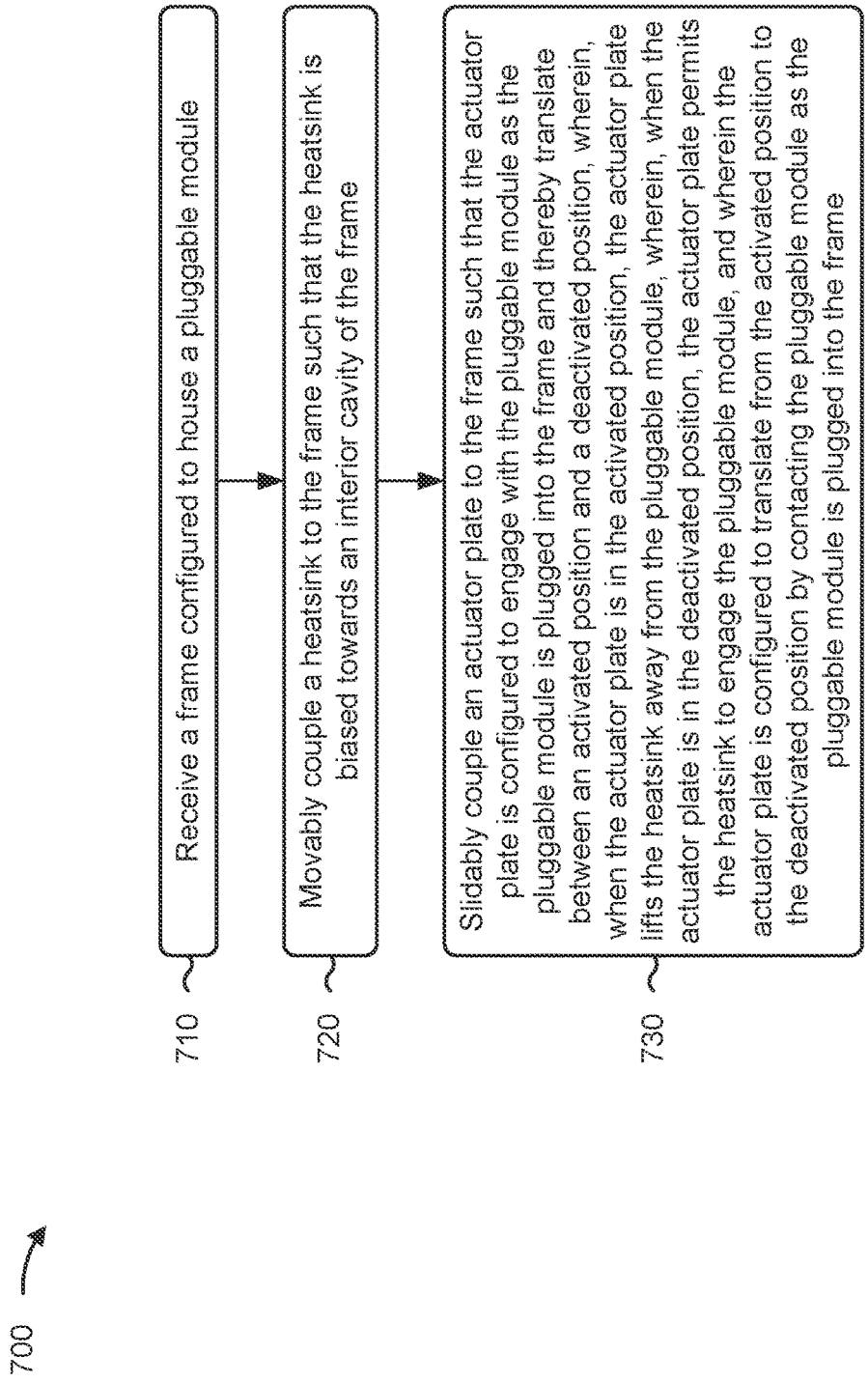
FIG. 7 is a flowchart of an example process associated with manufacturing an actuating heatsink for pluggable modules.

FIG. 7 is a flowchart of an example process 700 associated with manufacturing an actuating heatsink for pluggable modules. In some implementations, one or more process blocks of FIG. 7 are performed by various network component manufacturing equipment.

As shown in FIG. 7, process 700 may include receiving a frame configured to house a pluggable module (block 710). For example, the manufacturing equipment may receive a frame (e.g., frame 102) configured to house a pluggable module, as described above.

As further shown in FIG. 7, process 700 may include movably coupling a heatsink to the frame such that the heatsink is biased toward an interior cavity of the frame (block 720). For example, the manufacturing equipment may movably couple a heatsink to the frame such that the heatsink is biased toward an interior cavity of the frame, as described above.

As further shown in FIG. 7, process 700 may include slidably coupling an actuator plate to the frame such that the actuator plate is configured to engage with the pluggable module as the pluggable module is plugged into the frame and thereby translate between an activated position and a deactivated position, wherein, when the actuator plate is in the activated position, the actuator plate lifts the heatsink away from the pluggable module, wherein, when the actuator plate is in the deactivated position, the actuator plate permits the heatsink to engage the pluggable module, and wherein the actuator plate is configured to translate from the activated position to the deactivated position by contacting the pluggable module as the pluggable module is plugged into the frame (block 730). For example, the manufacturing equipment may slidably coupling an actuator plate to the frame such that the actuator plate is configured to engage with the pluggable module as the pluggable module is plugged into the frame and thereby translate between an activated position and a deactivated position, wherein, when the actuator plate is in the activated position, the actuator plate lifts the heatsink away from the pluggable module, wherein, when the actuator plate is in the deactivated position, the actuator plate permits the heatsink to engage the pluggable module, and wherein the actuator plate is configured to translate from the activated position to the deactivated position by contacting the pluggable module as the pluggable module is plugged into the frame, as described above.

Process 700 may include additional implementations, such as any single implementation or any combination of implementations described below and/or in connection with one or more other processes described elsewhere herein.

In a first implementation, process 700 includes coupling a thermal interface material to the heatsink, wherein the thermal interface material is configured to be compressed between the heatsink and the pluggable module when the pluggable module is plugged into the frame.

In a second implementation, alone or in combination with the first implementation, process 700 includes disposing a protective film on a surface of the thermal interface material, wherein the protective film is configured to contact the pluggable module when the pluggable module is plugged into the frame.

In a third implementation, alone or in combination with one or more of the first and second implementations, process 700 includes forming a set of riser components in the actuator plate and a corresponding set of receiving components in the heatsink, wherein the actuator plate is slidably coupled to the frame such that, when the actuator plate is in the activated position, the set of riser components do not engage with the set of receiving components, and such that, when the actuator plate is in the deactivated position, each of the set of riser components engages with a corresponding one of the set of receiving components to thereby permit the heatsink to engage the pluggable module.

In a fourth implementation, alone or in combination with one or more of the first through third implementations, process 700 includes mounting a biasing member between the actuator plate and the frame, wherein the biasing member is configured to bias the actuator plate toward the activated position when the actuator plate is not in contact with the pluggable module.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A system, comprising:
   a frame configured to removably receive a pluggable module within an interior cavity; and
   a heatsink assembly coupled to the frame, the heatsink assembly including:
      a heatsink configured to transfer heat from the pluggable module;
      a clip coupling the heatsink to the frame and configured to bias the heatsink toward the interior cavity; and
      an actuator plate configured to engage with the pluggable module when the pluggable module is within the interior cavity and thereby translate between an activated position and a deactivated position,
      wherein, when the actuator plate is in the activated position, the actuator plate lifts the heatsink away from the pluggable module,
      wherein, when the actuator plate is in the deactivated position, the actuator plate permits the heatsink to engage the pluggable module, and
      wherein the actuator plate is configured to translate from the activated position to the deactivated position in response to contacting the pluggable module as the pluggable module is plugged into the frame.

2. The system of claim 1, wherein the actuator plate is further configured to translate from the deactivated position to the activated position, thereby lifting the heatsink away from the pluggable module, in response to the pluggable module being removed from the frame.

3. The system of claim 1, further comprising a thermal interface material coupled to the heatsink on a side of heatsink facing the interior cavity, wherein the thermal interface material is configured to be compressed between the heatsink and the pluggable module when the pluggable module is plugged into the frame.

4. The system of claim 3, wherein the thermal interface material is a compressible phase-change material.

5. The system of claim 3, further comprising a protective film disposed on a surface of the thermal interface material that faces the interior cavity.

6. The system of claim 3, wherein the actuator plate includes an opening, and wherein the thermal interface material extends through the opening.

7. The system of claim 1, wherein the actuator plate includes a set of riser components,
   wherein the heatsink includes a corresponding set of receiving components,
   wherein, when the actuator plate is in the activated position, the set of riser components do not engage with the set of receiving components, and
   wherein, when the actuator plate is in the deactivated position, each of the set of riser components engages with a corresponding one of the set of receiving components to thereby permit the heatsink to engage the pluggable module.

8. The system of claim 7, wherein the set of riser components includes a plurality of domes, and wherein the set of receiving components includes a plurality of countersunk holes.

9. The system of claim 7, wherein the set of riser components includes a plurality of ramps, and wherein the set of receiving components includes a plurality of notches.

10. The system of claim 1, further comprising a biasing member coupling the actuator plate to the frame, wherein the biasing member is configured to bias the actuator plate toward the activated position when the actuator plate is not in contact with the pluggable module.

11. A device, comprising:
    a heatsink configured to transfer heat from a pluggable module when the pluggable module is plugged into a frame;
    a clip coupled to the heatsink and configured to couple the heatsink to the frame and bias the heatsink toward the pluggable module when the pluggable module is plugged into the frame; and
    an actuator plate configured to engage with the pluggable module as the pluggable module is plugged into the frame and thereby translate between an activated position and a deactivated position, wherein, when the actuator plate is in the activated position, the actuator plate lifts the heatsink away from the pluggable module, wherein, when the actuator plate is in the deactivated position, the actuator plate permits the heatsink to engage the pluggable module, and wherein the actuator plate is configured to translate from the activated position to the deactivated position by contacting the pluggable module as the pluggable module is plugged into the frame.

12. The device of claim 11, further comprising a thermal interface material coupled to the heatsink, wherein the thermal interface material is configured to be compressed between the heatsink and the pluggable module when the pluggable module is plugged into the frame.

13. The device of claim 12, wherein the thermal interface material is a compressible phase-change material that includes a protective film disposed on a surface of the thermal interface material, and wherein the protective film is configured to contact the pluggable module when the pluggable module is plugged into the frame.

14. The device of claim 11, wherein the actuator plate includes a set of riser components, wherein the heatsink includes a corresponding set of receiving components, wherein, when the actuator plate is in the activated position, the set of riser components do not engage with the set of receiving components, and wherein, when the actuator plate is in the deactivated position, each of the set of riser components engages with a corresponding one of the set of receiving components to thereby permit the heatsink to engage the pluggable module.

15. The device of claim 11, further comprising a biasing member configured to bias the actuator plate toward the activated position when the actuator plate is not in contact with the pluggable module.

* * * * *